US012534808B2

(12) United States Patent
Teti et al.

(10) Patent No.: US 12,534,808 B2
(45) Date of Patent: Jan. 27, 2026

(54) METHODS AND APPARATUS FOR COATING FIBERS

(71) Applicant: General Electric Company, Schenectady, NY (US)

(72) Inventors: Guido Teti, Cincinnati, OH (US); Pierre-Andre Bui, Clifton Park, NY (US); Steven Robert Hayashi, Niskayuna, NY (US); Wiktor Serafin, Morrow, OH (US); Timothy Patrick Smith, Morrow, OH (US); James Anthony Ruud, Delmar, NY (US)

(73) Assignee: General Electric Company, Evendale, OH (US)

( * ) Notice: Subject to any disclaimer, the term of this patent is extended or adjusted under 35 U.S.C. 154(b) by 284 days.

(21) Appl. No.: 17/983,508

(22) Filed: Nov. 9, 2022

(65) Prior Publication Data

US 2024/0150899 A1 May 9, 2024

(51) Int. Cl.
*C23C 16/54* (2006.01)
*C23C 16/458* (2006.01)

(52) U.S. Cl.
CPC .......... *C23C 16/545* (2013.01); *C23C 16/458* (2013.01)

(58) Field of Classification Search
USPC .......... 118/DIG. 19
See application file for complete search history.

(56) References Cited

U.S. PATENT DOCUMENTS

| | | | | |
|---|---|---|---|---|
| 2,267,597 | A * | 12/1941 | Neville | D06M 23/00 118/425 |
| 5,609,912 | A | 3/1997 | Lackey et al. | |
| 5,891,249 | A | 4/1999 | Bieler et al. | |
| 6,024,898 | A | 2/2000 | Steibel et al. | |
| 6,168,827 | B1 | 1/2001 | Corman | |
| 8,945,307 | B2 | 2/2015 | Lawrence et al. | |
| 9,556,073 | B2 | 1/2017 | Adams | |
| 10,118,792 | B2 | 11/2018 | Grossman et al. | |
| 10,370,292 | B2 | 8/2019 | Dunn et al. | |
| 10,493,658 | B2 | 12/2019 | Brands et al. | |
| 11,148,373 | B2 | 10/2021 | Knutson et al. | |
| 2007/0099527 | A1 | 5/2007 | Brun et al. | |
| 2010/0159240 | A1 | 6/2010 | Shah et al. | |
| 2017/0029340 | A1 | 2/2017 | Weaver et al. | |
| 2017/0144329 | A1 | 5/2017 | Dunn et al. | |
| 2018/0230062 | A1 | 8/2018 | Grossman et al. | |
| 2019/0210932 | A1* | 7/2019 | Veljkovic | C04B 35/80 |
| 2022/0193303 | A1* | 6/2022 | Francis | A61L 27/3834 |
| 2023/0028215 | A1 | 1/2023 | Nguyen et al. | |

* cited by examiner

*Primary Examiner* — Ram N Kackar
(74) *Attorney, Agent, or Firm* — Dority & Manning, P.A.

(57) ABSTRACT

Frame for use in coating a reinforcing fiber are provided. The frame includes a first frame end having a first cross-sectional shape. The first cross-sectional shape has one or more contact locations that are spaced apart from each other. The reinforcing fiber contacts the first frame end at the one or more contact locations. Methods are also provided for coating such a fiber.

14 Claims, 11 Drawing Sheets

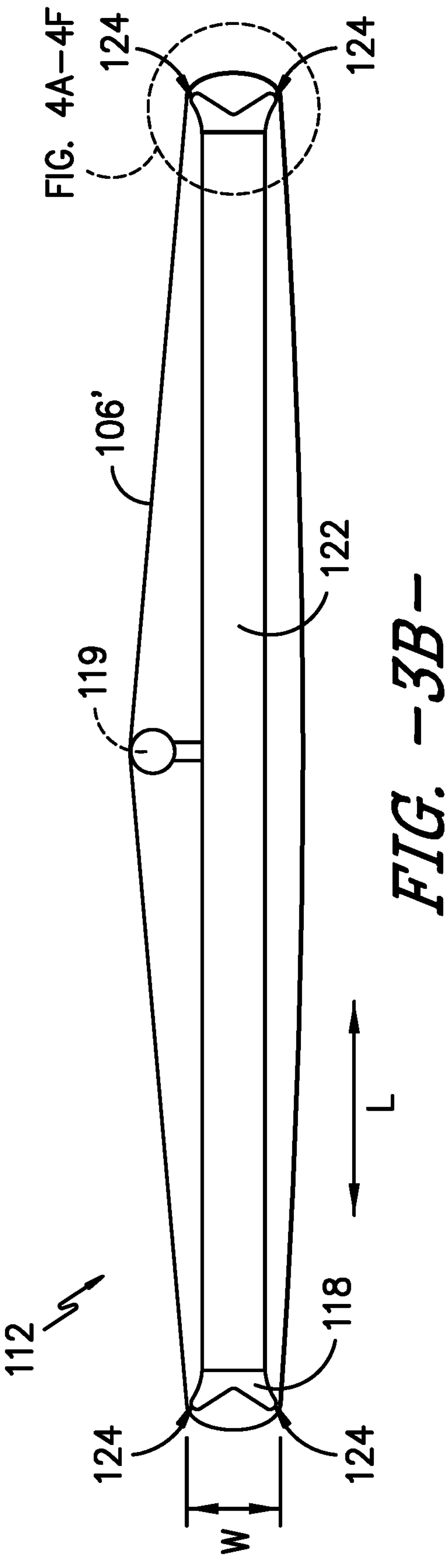
FIG. –3B–
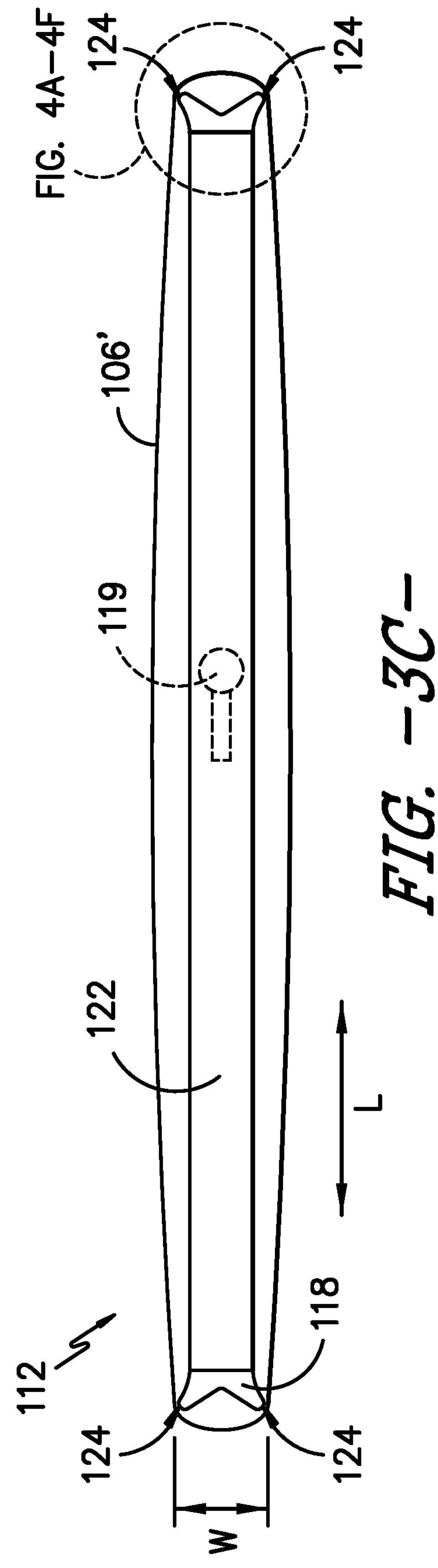
FIG. –3C–

METHODS AND APPARATUS FOR COATING FIBERS

FIELD

The present disclosure relates to frame contact geometries and systems for fiber coating.

BACKGROUND

Reinforced ceramic matrix composites ("CMCs") comprising fibers dispersed in continuous ceramic matrices of the same or a different composition are well suited for structural applications because of their toughness, thermal resistance, high-temperature strength, and chemical stability. Such composites typically have high strength-to-weight ratio that renders them attractive in applications in which weight is a concern, such as in aeronautic applications. Their stability at high temperatures render CMCs very suitable in applications in which components are in contact with a high-temperature gas, such as in a gas turbine engine.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which:

FIG. 3B is a schematic side view of the frame of FIG. 3A with a spacer bar in a raised position in accordance with an exemplary aspect of the present disclosure;

FIG. 3C is the schematic side view of the frame of FIG. 3B with the spacer bar in a lowered position in accordance with an exemplary aspect of the present disclosure;

DETAILED DESCRIPTION

Figure 1:
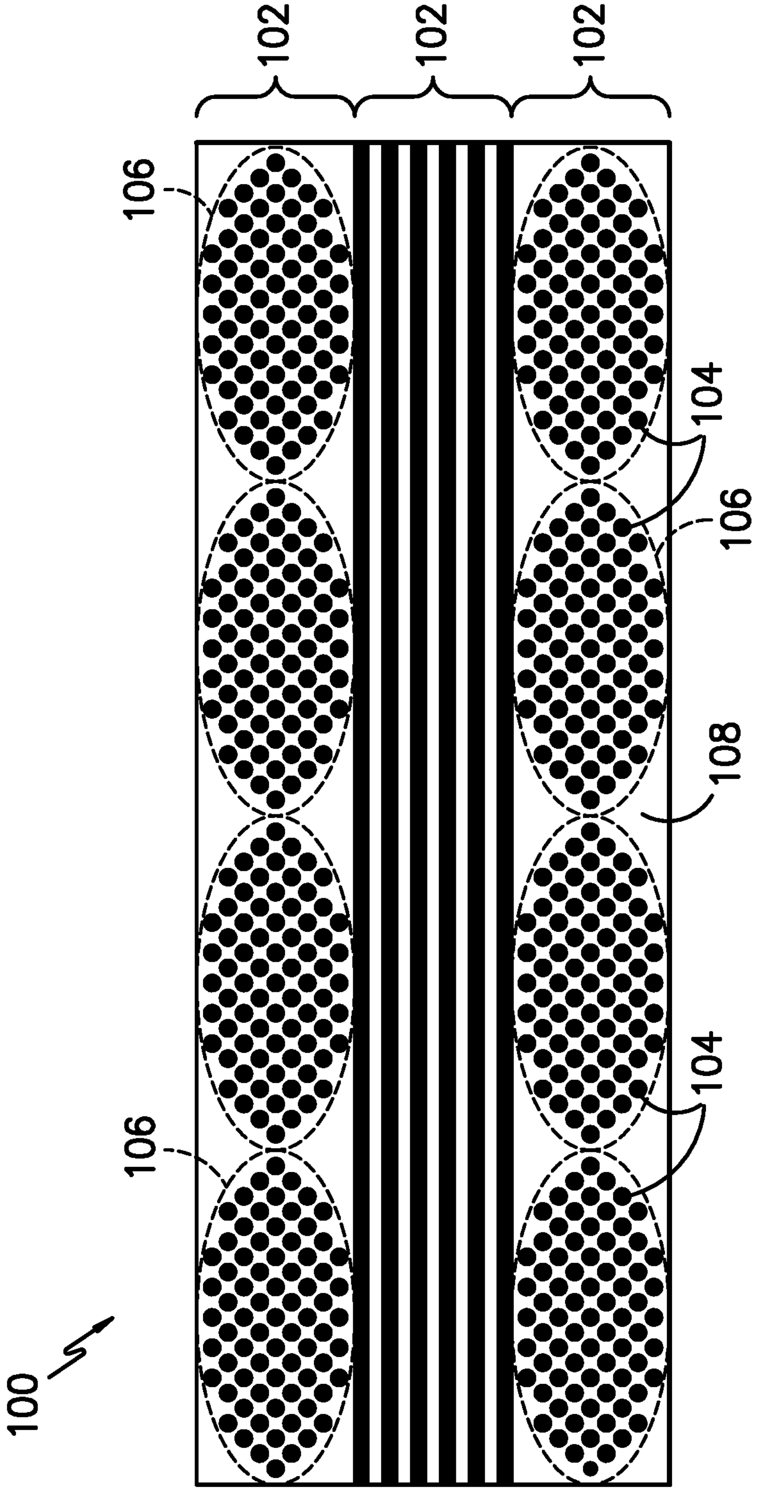
FIG. 1 is a schematic cross-sectional view of a portion of a ceramic matrix composite (CMC) component in accordance with an exemplary aspect of the present disclosure.

Reference will now be made in detail to present embodiments of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all embodiments described herein should be considered exemplary.

The singular forms "a", "an", and "the" include plural references unless the context clearly dictates otherwise.

The term "at least one of" in the context of, e.g., "at least one of A, B, and C" refers to only A, only B, only C, or any combination of A, B, and C.

The term "turbomachine" or "turbomachinery" refers to a machine including one or more compressors, a heat generating section (e.g., a combustion section), and one or more turbines that together generate a torque output.

The term "gas turbine engine" refers to an engine having a turbomachine as all or a portion of its power source. Example gas turbine engines include turbofan engines, turboprop engines, turbojet engines, turboshaft engines, etc., as well as hybrid-electric versions of one or more of these engines.

The terms "upstream" and "downstream" refer to the relative direction with respect to fluid flow in a fluid pathway. For example, "upstream" refers to the direction from which the fluid flows, and "downstream" refers to the direction to which the fluid flows.

As used herein, the terms "axial" and "axially" refer to directions and orientations that extend substantially parallel to a centerline of the gas turbine engine. Moreover, the terms "radial" and "radially" refer to directions and orientations that extend substantially perpendicular to the centerline of the gas turbine engine. In addition, as used herein, the terms "circumferential" and "circumferentially" refer to directions and orientations that extend arcuately about the centerline of the gas turbine engine.

The terms "coupled," "fixed," "attached to," and the like refer to both direct coupling, fixing, or attaching, as well as indirect coupling, fixing, or attaching through one or more intermediate components or features, unless otherwise specified herein.

As used herein, the terms "first," "second," and "third" may be used interchangeably to distinguish one component from another and are not intended to signify location or importance of the individual components.

For purposes of the description hereinafter, the terms "upper," "lower," "right," "left," "vertical," "horizontal," "top," "bottom," "lateral," "longitudinal," and derivatives thereof shall relate to the embodiments as they are oriented in the drawing figures. However, it is to be understood that the embodiments may assume various alternative variations, except where expressly specified to the contrary. It is also to be understood that the specific devices illustrated in the attached drawings, and described in the following specification, are simply exemplary embodiments of the disclosure. Hence, specific dimensions and other physical characteristics related to the embodiments disclosed herein are not to be considered as limiting.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer.

As used herein, ceramic-matrix-composite or "CMC" refers to a class of materials that include a reinforcing material (e.g., reinforcing fibers) surrounded by a ceramic matrix phase. Generally, the reinforcing fibers provide structural integrity to the ceramic matrix. Some examples of matrix materials of CMCs can include, but are not limited to, non-oxide silicon-based materials (e.g., silicon carbide, silicon nitride, or mixtures thereof), oxide ceramics (e.g., silicon oxycarbides, silicon oxynitrides, aluminum oxide ($Al_2O_3$), silicon dioxide ($SiO_2$), aluminosilicates, or mixtures thereof), or mixtures thereof. Optionally, ceramic particles (e.g., oxides of Si, Al, Zr, Y, and combinations thereof) and inorganic fillers (e.g., pyrophyllite, wollastonite, mica, talc, kyanite, and montmorillonite) may also be included within the CMC matrix.

Some examples of reinforcing fibers of CMCs can include, but are not limited to, non-oxide silicon-based materials (e.g., silicon carbide, silicon nitride, or mixtures thereof), non-oxide carbon-based materials (e.g., carbon), oxide ceramics (e.g., silicon oxycarbides, silicon oxynitrides, aluminum oxide ($Al_2O_3$), silicon dioxide ($SiO_2$), aluminosilicates such as mullite, or mixtures thereof), or mixtures thereof.

The reinforcing fibers may be at least portions of individual filaments or strands. As used herein, a "ceramic fiber tow," a "fiber tow," or simply a "tow" refers to a bundle of a plurality of individual fibers, filaments, or loose strands. The filaments of a tow may be randomly intermingled or arranged in a pattern, and/or may be continuous or non-continuous. For example, a tow may include broken filaments or filament segments. As another example, the filaments of a tow may be substantially parallel, twisted, or otherwise arranged. A tow may act substantially in the same manner as a single or individual filament. It will also be appreciated that an "individual ceramic filament," or simply an "individual filament," as used herein, refers to a singular or non-bundled elongate ceramic member.

Generally, particular CMCs may be referred to as their combination of type of fiber/type of matrix. For example, C/SiC for carbon-fiber-reinforced silicon carbide; SiC/SiC for silicon carbide-fiber-reinforced silicon carbide, SiC/SiN for silicon carbide fiber-reinforced silicon nitride; SiC/SiC—SiN for silicon carbide fiber-reinforced silicon carbide/silicon nitride matrix mixture, etc. In other examples, the CMCs may include a matrix and reinforcing fibers comprising oxide-based materials such as aluminum oxide ($Al_2O_3$), silicon dioxide ($SiO_2$), aluminosilicates, and mixtures thereof. Aluminosilicates can include crystalline materials such as mullite ($3Al_2O_3$ $2SiO_2$), as well as glassy aluminosilicates.

In certain embodiments, the reinforcing fibers may be bundled and/or coated prior to inclusion within the matrix. For example, bundles of the fibers may be formed as a reinforced tape, such as a unidirectional reinforced tape. A plurality of the tapes may be laid up together to form a preform component. The bundles of fibers may be impregnated with a slurry composition prior to forming the preform or after formation of the preform. The preform may then undergo thermal processing, such as a cure or burn-out to yield a high char residue in the preform, and subsequent chemical processing, such as melt-infiltration with silicon, to arrive at a component formed of a CMC material having a desired chemical composition.

Such materials, along with certain monolithic ceramics (i.e., ceramic materials without a reinforcing material), are particularly suitable for higher temperature applications. Additionally, these ceramic materials are lightweight compared to superalloys, yet can still provide strength and durability to the component made therefrom. Therefore, such materials are currently being considered for many gas turbine components used in higher temperature sections of gas turbine engines, such as airfoils (e.g., turbines, and vanes), combustors, shrouds and other like components, that would benefit from the lighter-weight and higher temperature capability these materials can offer.

During manufacturing of CMCs, the fibers are usually coated to help ensure the fibers survive the manufacturing processes, as well as to improve mechanical properties of the CMC in service. Often, the fibers are gathered into fiber bundles called tows, and the tows are subjected to a tow coating process. For instance, a tow can be wrapped around a rigid frame and hung in a reactor for coating, e.g., under high temperature and vacuum conditions. Accordingly, improved methods and apparatus addressing one or more of these challenges would be desirable.

The present disclosure is generally related to methods and apparatus for minimizing or eliminating low or uncoated regions of coated fibers or tows. For example, the present disclosure is directed to frames on which individual fibers and/or one or more tows can be wrapped to support the fibers or tows while a coating is applied thereto, where the frames have geometries to reduce contact between the fibers or tows and the frame. For example, a frame end of a frame for tow coating can have a shape or geometry that minimizes contact between the tow and the frame end. Minimizing contact between the tow and the frame end allows coating of the tow while minimizing low or uncoated regions in the tow. As another example, a semi-static coating process in which the tow is moved relative to a frame can help minimize or eliminate low or uncoated regions of a coated tow. Further, utilizing a frame design and/or coating method as described herein may help ensure a composite component meets material specifications by minimizing or eliminating flaws introduced during coating the fibers or tows used to form the composite component.

Referring now to the drawings, wherein identical numerals indicate the same elements throughout the figures, FIG. 1 is a schematic cross-sectional view of a composite component 100, such as a CMC component. As previously described, one process of manufacturing CMC components entails the use of a reinforced tape impregnated with a slurry, which may be referred to as a prepreg. The prepreg is usually in the form of a ply or sheet and unidirectional prepregs frequently comprise a two-dimensional fiber array comprising a single layer of aligned tows impregnated with a matrix precursor to create a generally two-dimensional lamina. Multiple plies of the resulting prepregs can be stacked and debulked to form a laminate preform, a process referred to as "lay-up." The prepregs are typically, but not necessarily, arranged so that tows of adjacent prepregs are oriented transverse (e.g., perpendicular) to each other, providing greater strength in the laminar plane of the preform (corresponding to the principal (load-bearing) directions of the final CMC component). However, the prepregs may be arranged in other ways as well, e.g., tows of one or more adjacent prepregs may not be oriented transverse or perpendicular to each other but, in various embodiments, may be parallel to each other, offset from each other less than 90 degrees, etc. A stack of prepregs may include adjacent prepregs having a variety of tow orientations with respect to each other.

FIG. 1 represents a cross-sectional view of a portion of a composite component 100 including multiple lamina 102. Each lamina 102 is formed from an individual prepreg tape or sheet. As shown in FIG. 1, each lamina 102 contains a ceramic reinforcement made up of unidirectionally-aligned fibers 104 formed into tows 106 and encased in a ceramic matrix 108. The ceramic matrix 108 is formed by conversion (e.g., after firing) of a ceramic matrix precursor in the slurry used to impregnate the reinforced tape.

Figure 2:
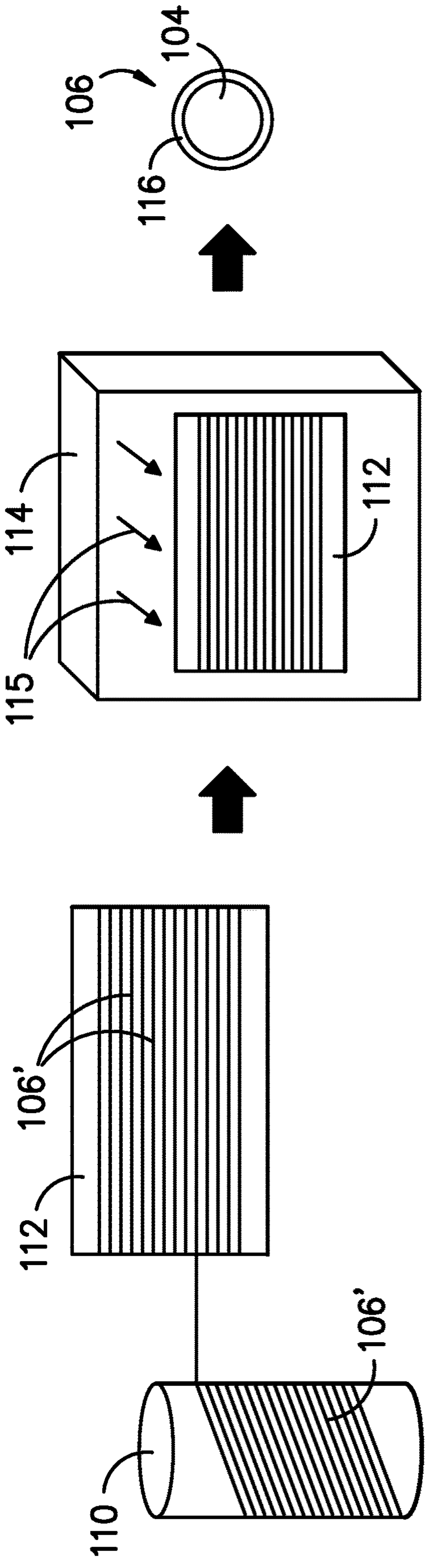
FIG. 2 is a schematic view of various components, such as a bobbin, frame, and reactor, used in a fiber coating process in accordance with an exemplary aspect of the present disclosure.

Referring to FIG. 2, prior to or as part of forming the reinforced tape, uncoated tows 106' are wound onto a bobbin 110, i.e., the fiber source. The uncoated tows 106' can be unwound from the bobbin 110 for coating. The fibers, e.g., bundled together in the form of uncoated tows 106', are coated for several purposes, such as to protect them during composite processing, to modify fiber-matrix interface strength, and/or to promote or prevent mechanical and/or chemical bonding of the fiber and matrix. A number of different techniques have been developed for applying fiber coatings, such as slurry-dipping, sol-gel, sputtering, and chemical vapor deposition (CVD). Of these, CVD has been most successful in producing impervious coatings of uniform thickness and controlled composition.

In a typical CVD process, fibers and reactants are heated to some elevated temperature where coating precursors decompose and deposit as a coating. CVD coatings can be applied either in a continuous process or a batch process. In a continuous process, fibers and coating precursors are continuously passed through a reactor.

As shown in FIG. 2, in a batch process, a length of fiber (e.g., a length of an uncoated tow 106') is unwound from the bobbin 110 onto a frame 112. The fiber may be under tension as it is wound onto the frame 112. For instance, a winding tension may be maintained on the fiber as it is unwound from the bobbin 110 onto the frame 112. In some embodiments, the winding tension may be within a range of about 0.01% of a breaking strength of an uncoated tow 106' to about 90% of the breaking strength of the uncoated tow 106'. As one example, the winding tension may be within a range of about 20 grams to about 100 grams.

Once disposed on the frame 112 and unwinding from the bobbin 110 has ceased, the tension on the fiber may be relaxed to a steady state tension. For instance, the frame 112 or a component thereof (such as a spacer bar as described below with respect to FIGS. 3B and 3C) may be relaxed, withdrawn, etc. to change the perimeter of the frame 112, which relaxes the tension on the fibers. The steady state tension on the fiber is lower than the winding tension and may be very low, e.g., essentially zero.

After the fiber is transferred to the frame 112, the frame 112 is then introduced into a reactor 114 and remains within the reactor 114 while reactants 115 are passed through the reactor 114. As previously described, a temperature within the reactor 114 may be elevated such that, as reactants 115 are passed through the reactor 114, coating precursors decompose and deposit as a coating 116 on the uncoated tow 106' to form tow 106. The tow 106, now coated with the coating 116, may then be formed into a reinforced tape, which may be impregnated with a slurry to form a prepreg tape, sheet, or ply used to form a CMC component, such as composite component 100, as described herein.

It will be appreciated that FIG. 2 provides only a general, schematic depiction of apparatus for transferring uncoated fiber from a fiber source to a frame for depositing a coating onto the fiber in a reactor. Other components, such as a drive mechanism, one or more pulleys, one or more sensors, a controller, etc., may be used with the bobbin 110, frame 112, and reactor 114 to coat the uncoated tows 106' using a batch process as described herein.

Figure 3A:
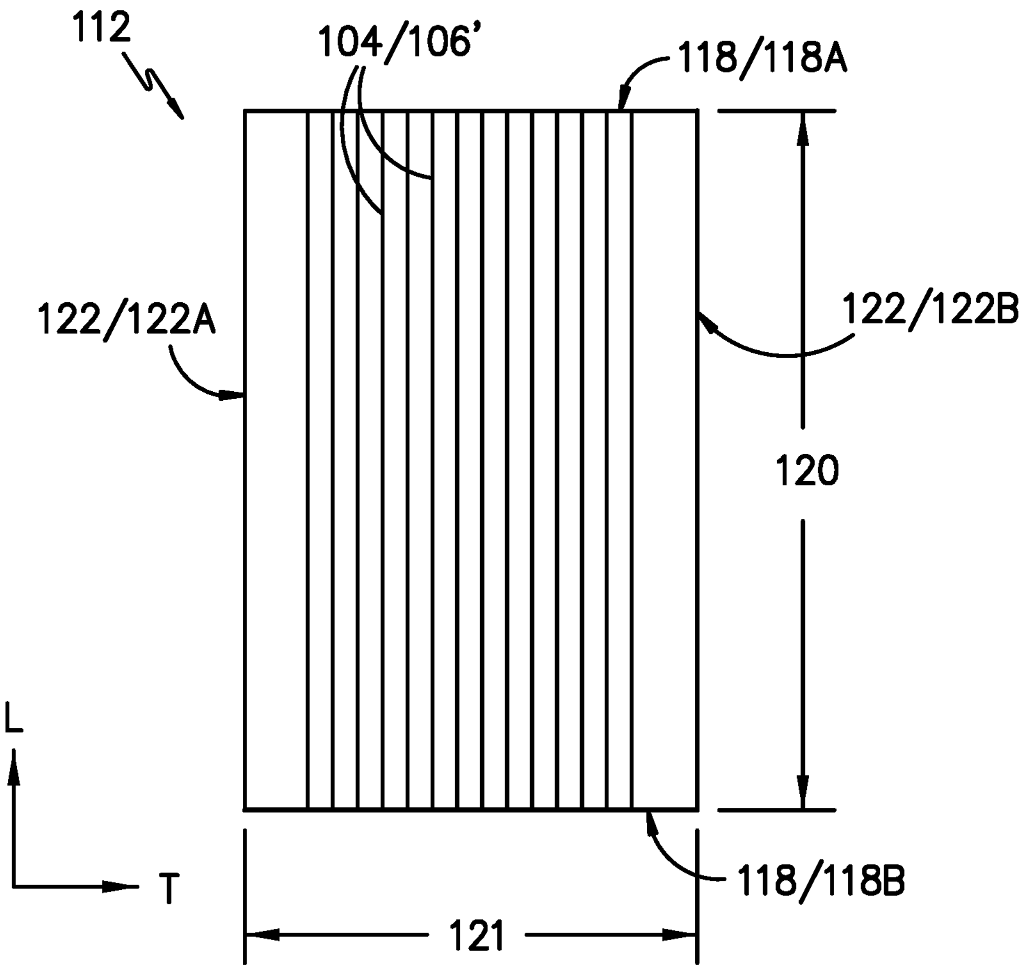
FIG. 3A is a schematic front view of a frame for supporting a reinforcing fiber in a fiber coating process in accordance with an exemplary aspect of the present disclosure.

Turning to FIGS. 3A, 3B, and 3C, the frame 112 will be described in greater detail. FIG. 3A provides a schematic view of the frame 112 according to various embodiments of the present subject matter. FIGS. 3B and 3C each provide a schematic side view of the frame 112 shown in FIG. 3A. FIGS. 3A, 3B, and 3C each illustrate reinforcing fiber extending around the frame ends 118; it will be appreciated that the reinforcing fiber wrapped around the frame 112 may be fiber 104 or uncoated tows 106' and hereinafter references to "reinforcing fiber" apply to either fiber 104, uncoated tows 106', or both. Further, the following description uses the singular term "tow," but it will be appreciated that the following description could apply to a single tow (e.g., a single uncoated tow 106' wound on the frame 112 that is coated and unwound from the frame 112 as a single coated tow 106) or to multiple tows (e.g., multiple lengths of uncoated tows 106' are wound onto the frame 112, coated, and unwound from the frame 112 as multiple lengths of coated tows 106).

As shown in FIG. 3A, the frame 112 includes a first frame end 118A and a second frame end 118B opposite the first frame end 118A. The first frame end 118A and the second frame end 118B may be configured in the same manner, such that the first frame end 118A and the second frame end 118B are identical to one another, or the first frame end 118A may be configured differently from the second frame end 118B. Unless stated otherwise, descriptions herein directed to "frame end 118" apply to the first frame end 118A, the second frame end 118B, or both.

The first frame end 118A is spaced apart from the second frame end 118B along a longitudinal direction L by a frame side length 120. The frame 112 also includes two or more frame sides 122 extending between the first frame end 118A and the second frame end 118B. A rectangular frame 112 is illustrated in the embodiment of FIG. 3A, with a first frame side 122A and a second frame side 122B opposite the first frame side 122A that each extend between the first frame end 118A and the second frame end 118B. The first frame side 122A and the second frame side 122B are spaced apart from one another along a lateral direction T by a frame end length 121. It will be appreciated that the frame 112 may have other shapes as well, with different numbers of frame ends 118 and frame sides 122.

Further, in the embodiment of FIG. 3A, the reinforcing fiber 104, which may be in the form of an uncoated tow 106' as described above, is wrapped around the frame 112 such that the reinforcing fiber 104 contacts each frame end 118 at one or more contact locations 124 (FIGS. 3B and 3C). However, it will be appreciated that, in other embodiments, the reinforcing fiber 104 may be wrapped around the frame 112 in contact with the frame sides 122 in addition to or as an alternative to the frame ends 118. Accordingly, the description provided herein of the shapes and/or geometries of the frame ends 118 and/or the motion of the reinforcing fiber 104 relative to the frame ends 118 may be applied to the frame sides 122.

As previously described, the frame 112 may be configured to help maintain tension on the fiber as it is wound on the frame 112 and to help relax or remove tension on the fiber once wound on the frame 112, which can help ensure proper coating of the fiber. For example, as shown in FIGS. 3B and 3C, the frame 112 may include a component such as a spacer bar 119 that can transition from a raised position (FIG. 3B) to a lowered position (FIG. 3C) to relax the tension on the uncoated tow 106' wound on the frame 112.

More particularly, FIG. 3B illustrates the spacer bar 119 in its raised position, and FIG. 3C illustrates the spacer bar 119 in its lowered position. In the raised position, the spacer bar 119 increases the perimeter of the frame 112; the uncoated tow 106' may be wound on the frame 112 with the spacer bar 119 in the raised position. In the lowered position, the spacer bar 119 is retracted within the frame 112 such that the circumference of the frame 112 is reduced. The spacer bar 119 may be transitioned to its lowered position after winding the uncoated tow 106' on the frame 112 is complete, which reduces the circumference of the frame 112 supporting the uncoated tow 106', thereby relaxing or reducing the tension on the uncoated tow 106'. Relaxing the tension on the uncoated tow 106' may cause the uncoated tow 106' to separate from one another and/or the frame 112, providing increased space or room for the reactants to surround the uncoated tow 106' and thereby coat the uncoated tow 106' to form a coated tow 106.

It will be appreciated that the spacer bar 119 shown in FIG. 3B is by way of example only. The spacer bar 119 may have any appropriate shape and size, and may be disposed at any appropriate location along the frame 112, to support the fiber on the frame 112 as described herein. Further, in some embodiments, more than one spacer bar 119 may be used, and in still other embodiments, a feature or component other than one or more spacer bars 119 may be used to maintain and relax tension on the fiber as described herein. Additionally, changing the distance between the frames 112 (e.g., the distance between the respective ends of adjacent frames 112) using a collapsible frame may also be considered.

Additionally or alternatively, the shape of the frame ends 118 may promote thorough coating of the fiber. In particular embodiments, the frame end 118 may be static relative to the frame 112. Alternatively, the frame end 118 may be moveable relative to the frame 112.

Referring now to FIGS. 4A through 4F, each frame end 118 has a cross-sectional shape including one or more contact locations 124 (shown as 124A and 124B in FIGS. 4A-4F), which adjacent contact locations 124A,124B spaced apart from one another by a separation length 126. Each of FIGS. 4A through 4F provides a cross-sectional view of a different shaped frame end 118 of the frame 112 (represented as frame ends 118, 118', 118'', 118''', 118'''', and 118''''', respectively). For example, in the embodiment of FIG. 4A, the cross-sectional shape of the frame end 118 is a duckbill shape including a first contact location 124A spaced apart from a second contact location 124B by the separation length 126.

Figure 4A:
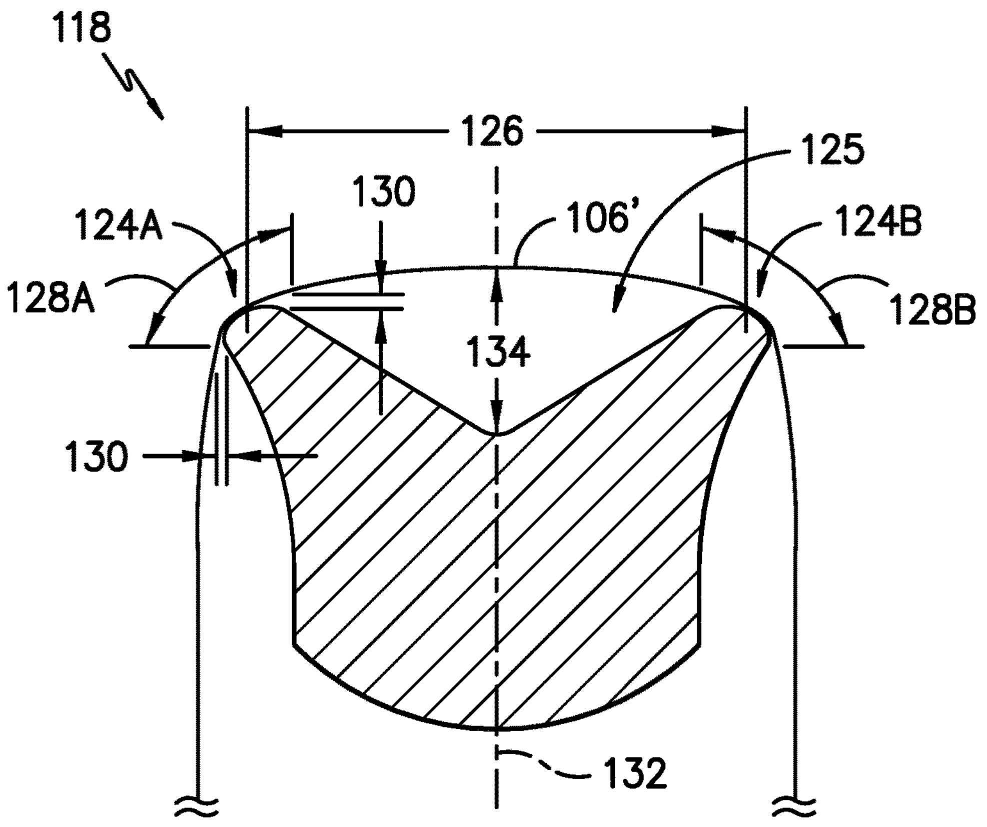
FIG. 4A is a cross-sectional view of a frame end (e.g., of the frame shown in FIGS. 3B and 3C) having a duckbill shape in accordance with an exemplary aspect of the present disclosure.

To promote adequate coating, a minimal length of uncoated tow 106' should be in contact with or relatively close to the frame 112. For example, the number of contact locations 124 and/or the length of uncoated tow 106' within a minimum distance 130 from the frame end 118 may be minimized to promote coating of as much of the tow as possible. Referring to FIG. 4A, the frame end 118 slopes inward toward a midline 132 from each of the first contact location 124A and the second contact location 124B to define a generally V-shaped slot 125 between the first and second contact locations 124A, 124B. As such, a distance between the uncoated tow 106' and the frame end 118 varies along the separation length 126. More particularly, the distance between the uncoated tow 106' and the frame end 118 varies from zero at the contact locations 124A, 124B (i.e., the uncoated tow 106' contacts the frame end 118 at the contact locations 124A, 124B) to a maximum distance 134 at the deepest point of the V-shaped slot 125 (i.e., at the midline 132). For instance, moving left to right in FIG. 4A from the first contact location 124A to the second contact location 124B, the distance between the uncoated tow 106' and the frame end 118 increases from the first contact location 124A to the midline 132 and decreases from the midline 132 to the second contact location 124B.

Further, moving from each contact location 124A, 124B along the frame side length 120, the distance between the uncoated tow 106' and the frame end 118 increases. Moreover, the duckbill-shaped frame end 118 shown in FIG. 4A is undercut, which shortens the length of the uncoated tow 106' that is spaced apart from the frame 112 by the minimum distance 130 or less. The minimum distance 130 may be the smallest spacing between the uncoated tow 106' and the frame 112 at which, during the coating process, the reactants 115 (FIG. 2) do not interact with a material from which the frame 112 is formed to inhibit the formation of the coating 116 on the uncoated tow 106'. In some embodiments, the minimum distance 130 may be at least two times a diameter of the uncoated tow 106'; in other embodiments, the minimum distance 130 may be at least three times the diameter of the uncoated tow 106', at least four times the diameter of the uncoated tow 106', at least five times the diameter of the uncoated tow 106', at least six times the diameter of the uncoated tow 106', or at least seven times the diameter of the uncoated tow 106'.

Accordingly, for the embodiment shown in FIG. 4A, the frame end 118 slopes to the midline 132 along a width W of the frame end 118 and is undercut moving away from the contact locations 124A, 124B along the frame side length 120. A first length 128A of the uncoated tow 106' is defined by sum of the first contact location 124A and the adjacent minimum distances 130 from the frame end 118 on both sides. A second length 128B of the uncoated tow 106' is defined by sum of the first contact location 124A and the adjacent minimum distances 130 from the frame end 118 on both sides. In such an embodiment, the first length 128A is less than the separation length 126 that is adjacent to that first length 128A. The duckbill shaped frame end 118 shown in FIG. 4A helps minimize the total length of the uncoated tow 106' within the minimum distance 130 from the frame end 118, e.g., by having only two contact locations 124, undercutting the frame end 118, and sloping away from the contact locations 124 as described herein. It will be appreciated that the total length of the uncoated tow 106' within the minimum distance 130 from the frame end 118 is the sum of each length of the uncoated tow 106' within the minimum distance 130 from the frame end 118. For example, for the embodiment of FIG. 4A, the total length of the uncoated tow 106' within the minimum distance 130 from the frame end 118 is the sum of the first length 128A and the second length 128B.

It will be understood that the midline 132 is defined through a widthwise center of the cross-sectional shape of the frame end 118, where a width W of the frame end 118 is perpendicular or orthogonal to each of the longitudinal direction L and the lateral direction T (FIG. 3A) defined by the frame 112. Further, it will be appreciated that, in at least some embodiments, the generally V-shaped slot 125 extends along the lateral direction T over the frame end length 121. For example, the generally V-shaped slot 125 may be defined along the frame end 118 such that the generally V-shaped slot 125 extends from the first frame side 122A (FIG. 3A) to the second frame side 122B (FIG. 3A).

Thus, as shown in FIG. 4A, the fibers 104 or uncoated tow 106' are wrapped around the frame 112 such that the fibers 104 or uncoated tow 106' contact the first contact location 124A and the second contact location 124B of the frame end 118 and are spaced apart from the frame 112 by the minimum distance 130 or less over a first length 128A including the portion of the fibers 104 or uncoated tow 106' contacting the first contact location 124A and a second length 128B including the portion of the fibers 104 or uncoated tow 106' contacting the second contact location 124B. However, the remainder of the fibers 104 or uncoated tow 106' are spaced apart from the frame 112 by more than the minimum distance 130 to allow a coating to be deposited on the reinforcing fibers, e.g., by a chemical vapor deposition (CVD) process or other suitable coating process as described herein. It will be appreciated that, for frames 112 having two frame ends 118 configured in a substantially similar manner (e.g., having the same cross-sectional shape), the frame end 118 illustrated in FIG. 3B may be a first frame end 118A and the reinforcing fibers (i.e., fibers 104 or uncoated tows 106') may contact a third contact location and a fourth contact location of a second frame end 118B in a substantially similar way as the reinforcing fiber contacts the first and second contact locations 124A, 124B shown in FIG. 4A.

As shown in FIG. 4A, the cross-sectional shape of the frame end 118 defines two contact locations 124, which are configured to contact the reinforcing fiber. FIGS. 4B through 4F depict additional or alternative embodiments of the frame end 118, with the cross-sectional shape of the frame end 118 depicted in each embodiment having a plurality of contact locations 124. It will be understood that the additional or alternative embodiments of the frame ends are not mutually exclusive and can be utilized in combination in the same frame and/or the same system having multiple frames. As illustrated in FIGS. 4A through 4F, in various embodiments of the frame end 118, the plurality of contact locations 124 may have a periodicity factor of at least 2. That is, the contact locations 124 may have a pattern that appears at least twice.

Figure 4B:
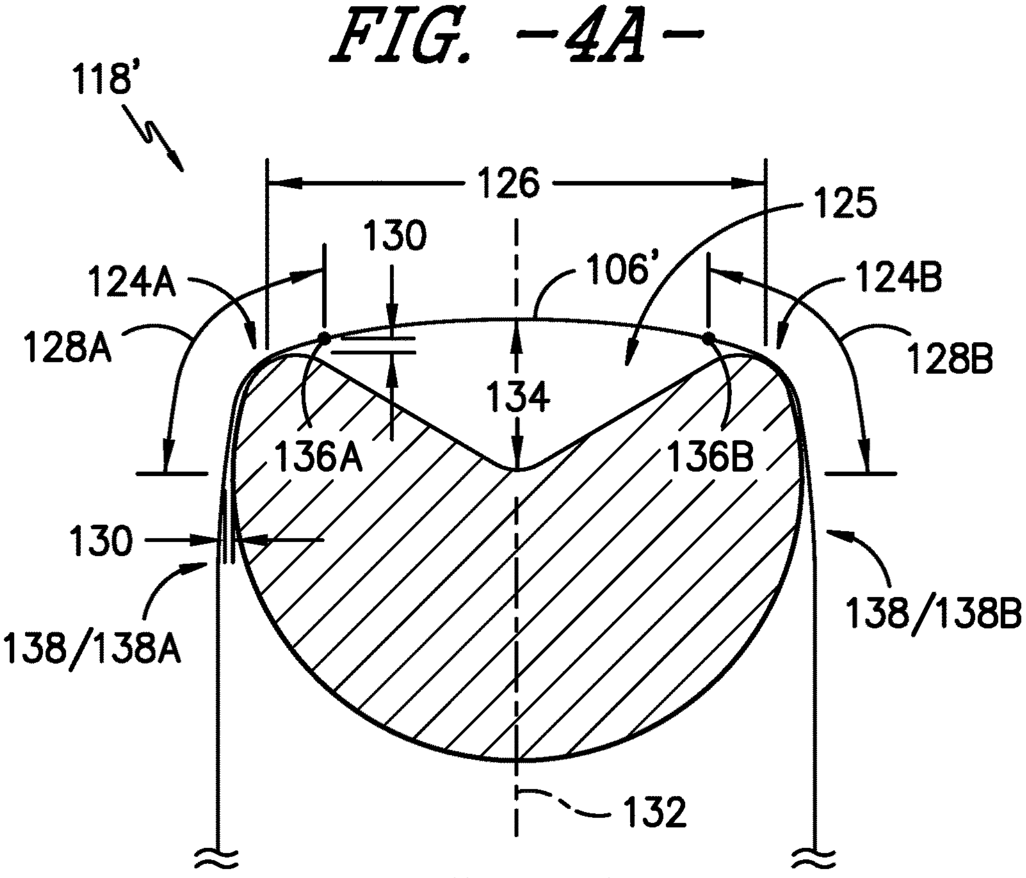
FIG. 4B is a cross-sectional view of a frame end (e.g., of the frame shown in FIGS. 3B and 3C) having an opened mouth shape in accordance with an exemplary aspect of the present disclosure.

Turning to FIG. 4B, the cross-sectional shape of the frame end 118' may be an opened mouth shape, which is a major sector of a circle, with or without rounded edges, or also may be referred to as a pacman shape. Like the duckbill shape shown in FIG. 4A, the opened mouth shape of the frame end 118' shown in FIG. 4B comprises a generally V-shaped slot 125 between a first contact location 124A and a second contact location 124B. The generally V-shaped slot 125 may extend along the lateral direction T over the frame end length 121. For instance, in at least some embodiments, the generally V-shaped slot 125 is defined along the frame end 118 such that the generally V-shaped slot 125 extends from the first frame side 122A (FIG. 3A) to the second frame side 122B (FIG. 3A).

The opened mouth shape shown in FIG. 4B differs from the duckbill shape shown in FIG. 4A along widthwise edges of the respective frame ends 118, 118'. For example, the duckbill shape of FIG. 4A is undercut as described above, with the widest part, or largest width W, of the duckbill shape frame end 118 including the first contact location 124A and the second contact location 124B. In contrast, the opened mouth shape of FIG. 4B includes rounded edges 138, with a first rounded edge 138A arcing outward widthwise with respect to the frame end 118' from the first contact location 124A and a second rounded edge 138B arcing outward widthwise with respect to the frame end 118' from the second contact location 124B. The widest part, or largest width W, of the opened mouth shape of the frame end 118' shown in FIG. 4B is spaced apart from each of the contact locations 124, between lines extending tangential to the rounded edges 138 and parallel to the longitudinal direction L. Thus, a length 128 of the uncoated tow 106' is within the minimum distance 130 of the frame end 118' adjacent each rounded edges 138 at the largest width W of the opened mouth shaped frame end 118' of FIG. 4B. More particularly, a first length 128A of the uncoated tow 106' is within the minimum distance 130 from the first rounded edge 138A to a first location 136A past the first contact location 124A along the widthwise direction toward the second contact location 124B, and a second length 128B of the uncoated tow 106' is within the minimum distance 130 from the second rounded edge 138B to a second location 136B past the second contact location 124B along the widthwise direction toward the first contact location 124A.

Figure 4C:
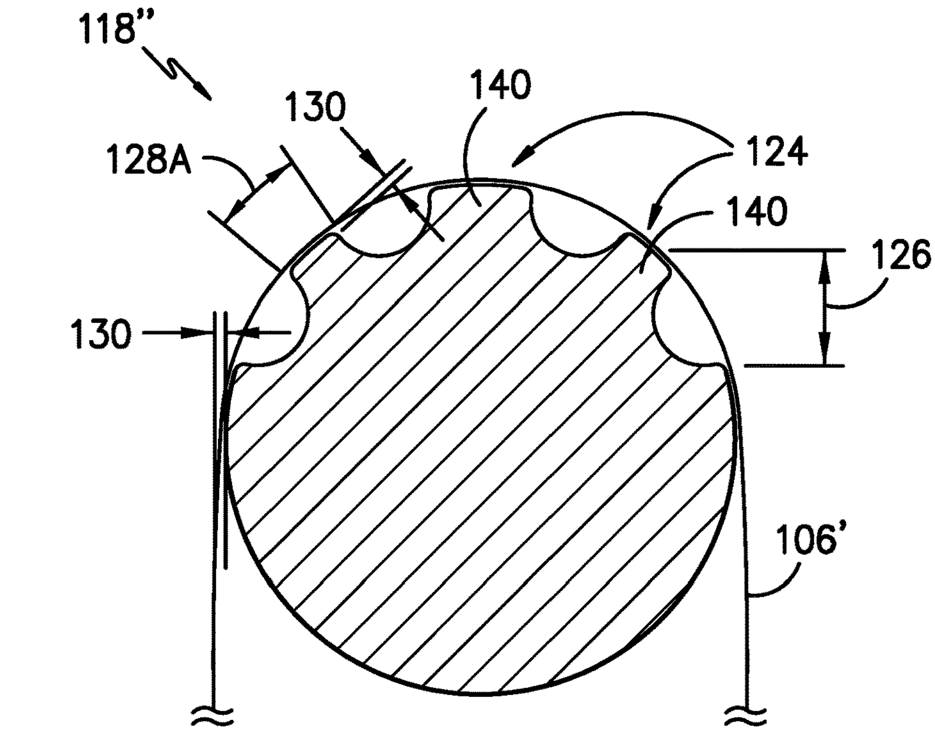
FIG. 4C is a cross-sectional view of a frame end (e.g., of the frame shown in FIGS. 3B and 3C) having a ribbed shape in accordance with an exemplary aspect of the present disclosure.

Referring now to FIG. 4C, in some embodiments, the cross-sectional shape of the frame end 118" is a ribbed shape. As shown in FIG. 4C, the ribbed shape may include a plurality of ribs 140, with each rib 140 spaced apart from an adjacent rib 140 by the separation length 126, either with similar or differing spacing between adjacent ribs 140. That is, each rib 140 defines a contact location 124, and as described with respect to FIG. 4A, adjacent contact locations may be spaced apart by the separation length 126. It is noted that each rib 140 may be the same in size and shape, or each rib may differ in size and shape. Further, as described with respect to FIGS. 4A and 4B, lengths 128 of uncoated tow 106' may be within the minimum distance 130 adjacent each rib 140, as well as adjacent the rounded edges 138 of the ribbed shaped frame end 118". The total length of uncoated tow 106' within the minimum distance 130 may be minimized as described herein to minimize low and uncoated regions of the tow upon completion of the coating process.

Figure 4D:
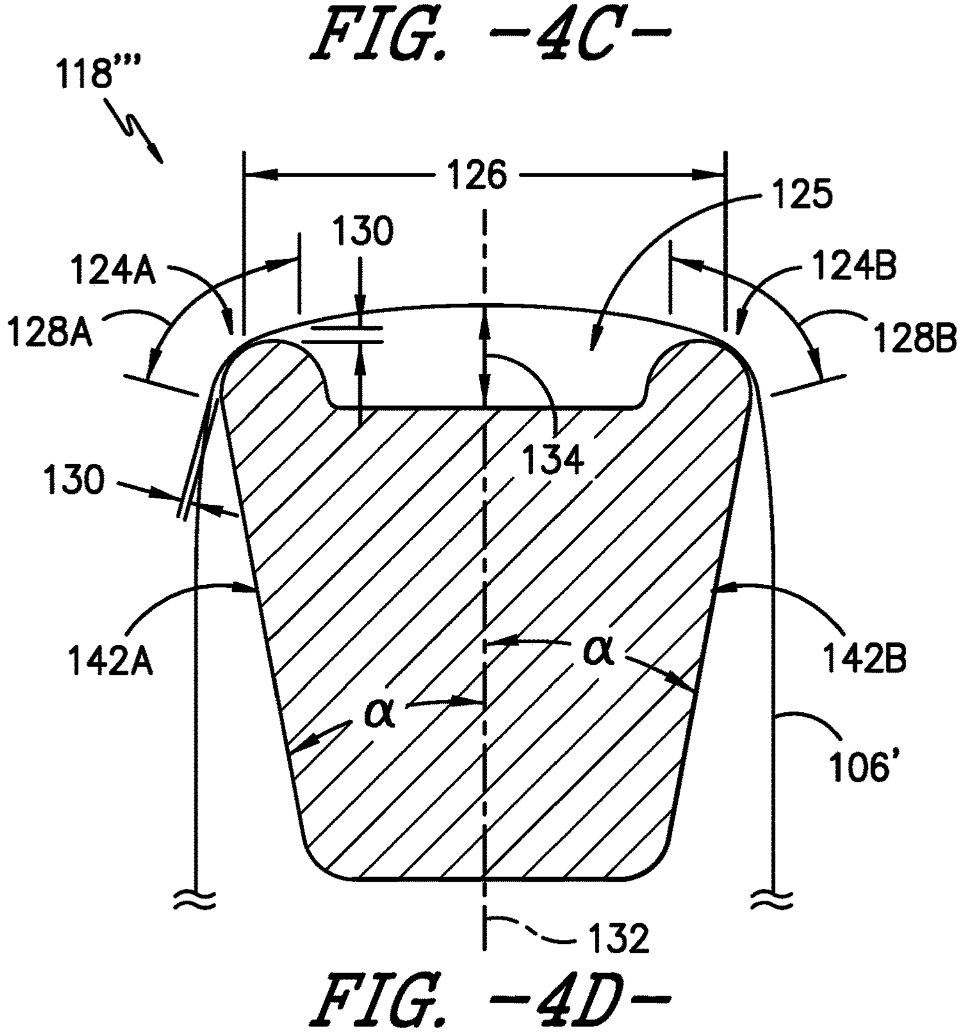
FIG. 4D is a cross-sectional view of a frame end (e.g., of the frame shown in FIGS. 3B and 3C) having a tooth shape in accordance with an exemplary aspect of the present disclosure.

As shown in FIG. 4D, in other embodiments, the cross-sectional shape of the frame end 118'" is a tooth shape. Similar to the embodiments of FIGS. 4A and 4B, the tooth shape of the frame end 118'" of FIG. 4D includes two contact locations 124, a first contact location 124A and a second contact location 124B. The tooth shape also may include a first linear edge 142A extending from the first contact location 124A inward toward a midline 132 and a second linear edge 142B extending from the second contact location 124B inward toward the midline 132. An angle α may be defined between each of the first linear edge 142A and the second linear edge 142B and the midline 132. The angle α may be a non-zero angle less than 90°, such as, in some embodiments, within a range of about 5° to about 80°; in some embodiments, within a range of about 15° to about 60°; and in some embodiments, within a range of about 20° to about 45°. Further, like the embodiments shown in FIGS. 4A-4C, lengths 128 of uncoated tow 106' may be within the minimum distance 130 adjacent each contact location 124A, 124B of the tooth shaped frame end 118''', and the total length of uncoated tow 106' within the minimum distance 130 may be minimized as described herein to minimize low and uncoated regions of the tow upon completion of the coating process.

Figure 4E:
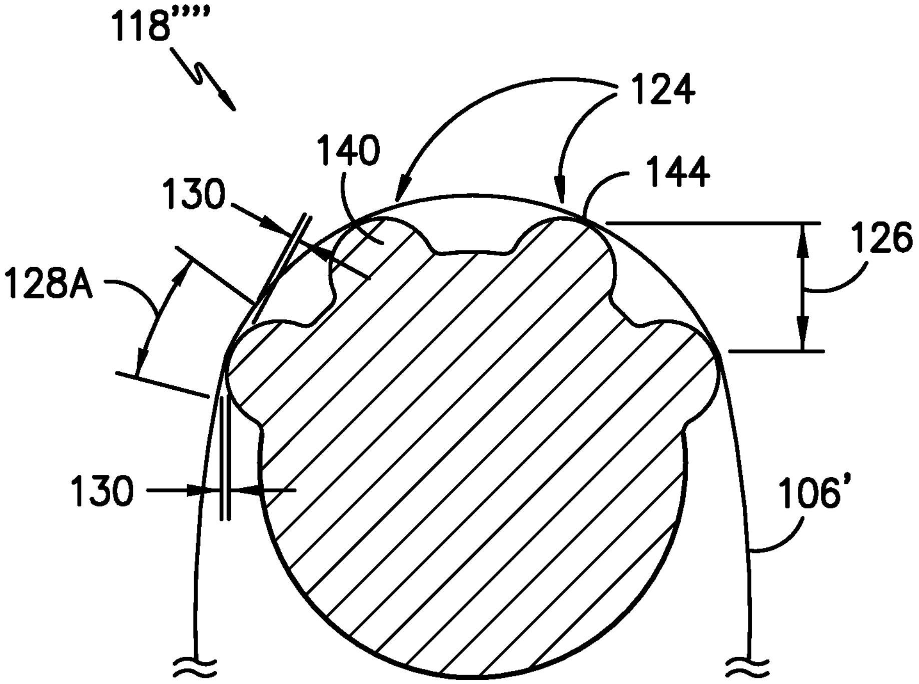
FIG. 4E is a cross-sectional view of a frame end (e.g., of the frame shown in FIGS. 3B and 3C) having a fluted shape in accordance with an exemplary aspect of the present disclosure.

Referring now to FIG. 4E, in still other embodiments of the frame end 118'''', the cross-sectional shape is a fluted shape. The fluted shape may include a plurality of semicircular protrusions 144. As shown in FIG. 4E, each semicircular protrusion 144 may be spaced apart from an adjacent semicircular protrusion 144 by the separation length 126. It is noted that any number of protrusions, along with even or uneven spacing, may be utilized. Further, each semicircular protrusion 144 may define a contact location 124, where the reinforcing fiber contacts the fluted shape frame end 118'''' when the reinforcing fiber is wrapped around the frame 112. Similar to the embodiments of FIGS. 4A-4D, lengths 128 of uncoated tow 106' may be within the minimum distance 130 adjacent each contact location 124 of the fluted shape frame end 118, and the total length of uncoated tow 106' within the minimum distance 130 may be minimized as described herein to minimize low and uncoated regions of the tow upon completion of the coating process.

Figure 4F:
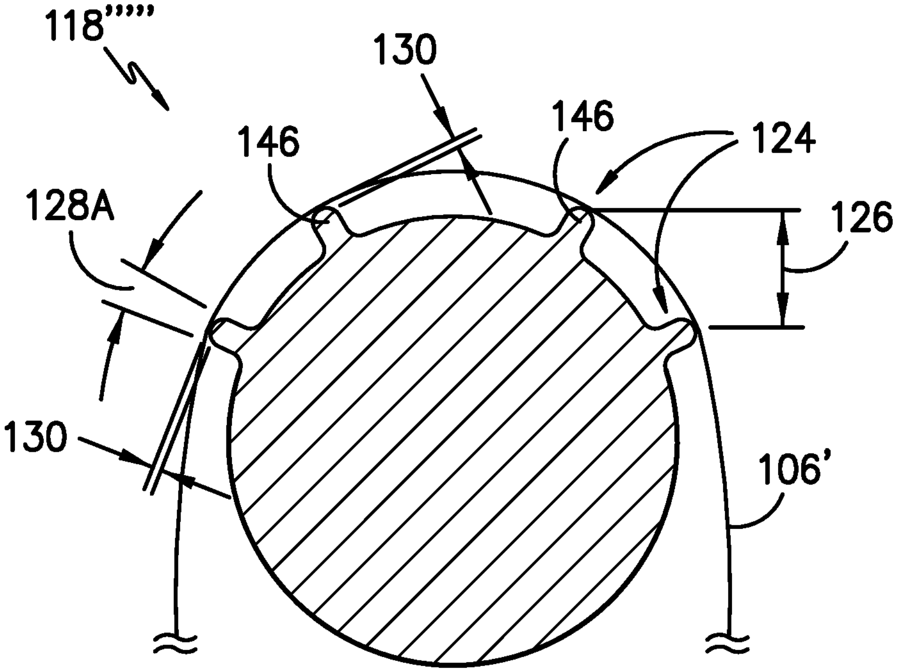
FIG. 4F is a cross-sectional view of a frame end (e.g., of the frame shown in FIGS. 3B and 3C) having a finned shape in accordance with an exemplary aspect of the present disclosure.

Turning to FIG. 4F, in yet other embodiments of the frame end 118''''', the cross-sectional shape is a finned shape. The finned shape may include a plurality of fins 146. Each fin 146 of the plurality of fins 146 may be spaced apart from an adjacent fin 146 by the separation length 126. It is noted that any number of protrusions, along with even or uneven spacing, may be utilized. Moreover, each fin 146 may define a contact location 124, where the reinforcing fiber contacts the finned shape frame end 118''''' when the reinforcing fiber is wrapped around the frame 112. Like the embodiments shown in FIGS. 4A-4E, lengths 128 of uncoated tow 106' may be within the minimum distance 130 adjacent each contact location 124 of the finned shape frame end 118'''''. The total length of uncoated tow 106' within the minimum distance 130 may be minimized as described herein to minimize low and uncoated regions of the tow upon completion of the coating process.

In each embodiment described herein, the frame 112 and frame end 118 may be configured such that a total length 128 of the uncoated tow 106' (e.g., the sum of the length of tow 106' within the minimum distance 130 on either side of the contact area 124A and the length of tow 106' within the contact area 124A) to the frame 112 is minimized. As such, the reactants may interact with the reinforcing fibers (rather than the frame 112) to coat the reinforcing fibers within minimal regions of no or low coated fiber area. For example, a ratio of the total length of the uncoated tow 106' (i.e., the sum of each length 128 for a given frame end 118) to the separation length 126 for a given frame end 118 may be within a range of about 2 to about 10,000, such as about 5 to about 1,000. Further, as described herein, the minimum distance 130 may be at least two times the diameter of the uncoated tow 106', such as two times, three times, four times, five times, six times, or seven or more times the diameter of the uncoated tow 106'. In some embodiments, the minimum distance 130 may depend on the material from which the frame 112 is formed, the reactants 115 (FIG. 2) used to deposit the coating 116 (FIG. 2) on the uncoated tow 106', or a combination of these or other factors.

Further, each contact location 124 may define a point contact between the frame end 118 and the reinforcing fiber. In some embodiments, the contact between the frame end 118 and the reinforcing fiber may be a line contact (i.e., having a plurality of adjacent points of contact) or a combination of point and line contacts. For example, for a given configuration of the frame end 118, one contact location 124 may define a point contact between the frame end 118 and the reinforcing fiber while another contact location 124 may define a line contact between the frame end and the reinforcing fiber.

As previously described, the coated reinforcing fiber (e.g., coated fibers or coated tows 106) may be formed into a composite component or article, such as the composite component 100 shown in FIG. 1, which may be a ceramic matrix composite (CMC) component. In at least some embodiments, the composite component 100 is a CMC component comprising silicon carbide (SiC) reinforcing fiber in a silicon carbide (SiC) matrix material such that the CMC component is a SiC/SiC component. However, a CMC component may be formed from other ceramic materials as described herein, and in appropriate embodiments, the composite component 100 may be formed from non-ceramic materials or from a mixture of ceramic and non-ceramic materials.

Figure 5B:
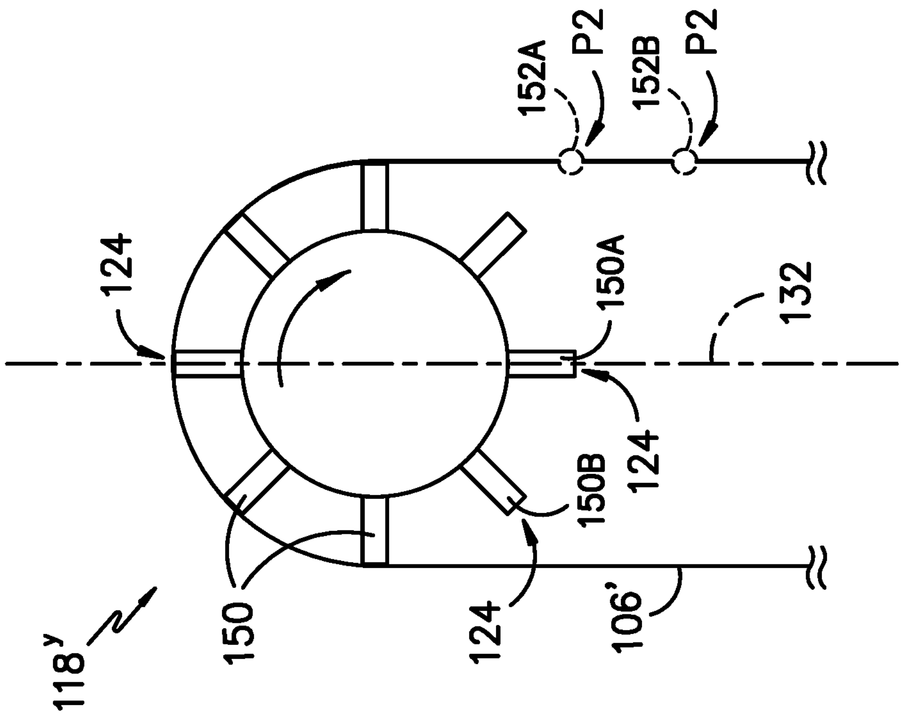
FIG. 5B is a schematic end view of a finned shape frame end (e.g., of the frame shown in FIGS. 3B and 3C) having a movement mechanism in accordance with an exemplary aspect of the present disclosure.
Figure 5A:
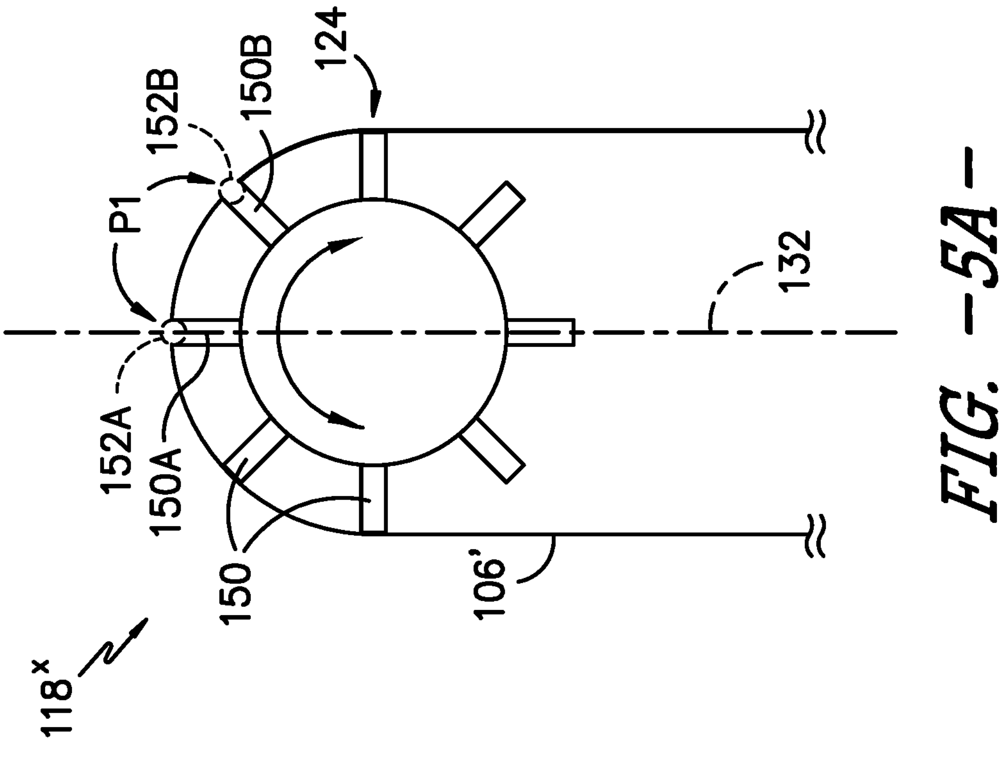
FIG. 5A is a schematic end view of a finned shape frame end (e.g., of the frame shown in FIGS. 3B and 3C) having a movement mechanism in accordance with an exemplary aspect of the present disclosure.

Referring now to FIGS. 5A and 5B, which show additional or alternative frame ends $\mathbf{118}^{X}$, $\mathbf{118}^{Y}$ (e.g., of frame 112 of FIGS. 3B and 3C), the reinforcing fiber (e.g., an uncoated tow 106' as shown in FIGS. 5A and 5B) may be moved relative to the midline 132 (of the frame 112 in FIGS. 3B and 3C) to reduce or eliminate low or uncoated regions in the reinforcing fiber upon completion of the coating process. For example, as shown in FIGS. 5A and 5B, at least one frame end 118 may be rotated, e.g., either clockwise or counterclockwise with respect to the lateral direction T (FIG. 2), which extends into and out of the page, to advance or move the reinforcing fiber during the coating process. One or more regions of the reinforcing fiber that, prior to the advancement or movement, may have been obstructed by the frame 112 from the formation of the coating 116 (FIG. 2) on the fiber may be exposed, after advancing or moving the reinforcement fiber relative to the frame 112, to the reactants 115 (FIG. 2). For instance, regions 152A, 152B of the reinforcing fiber that were in contact with a contact location 124 of the frame end 118 in a first position P1 may be advanced or moved to a second position P2 that is spaced apart from a respective contact location 124 to provide sufficient space for the reactants to interact with the reinforcing fiber for formation of the coating 116 (FIG. 2) thereon.

For purposes of explanation only, two such regions 152 are denoted in FIGS. 5A and 5B and are indicated by enlarged circles outlined with dashed lines only to aid in explanation. It will be appreciated that the enlarged circles indicating regions 152 are not intended to convey the size, extent, etc. of any such region 152.

As illustrated in FIGS. 5A and 5B, the frame end 118 may have a cross-sectional shape that is the same as or substantially similar to one of the cross-sectional shapes described with respect to FIGS. 4A through 4F. For example, the frame end 118 shown in FIGS. 5A and 5B has a cross-sectional shape that is a finned shape, such as described with respect to FIG. 4F, including a plurality of fins 150 that are spaced apart from one another. Referring to FIGS. 5A and 5B, the reinforcing fiber may contact the frame end 118 at a plurality of contact locations 124 that are each defined by a respective fin 150. By moving the frame end 118, e.g., by rotating the frame end 118 clockwise or counterclockwise as indicated by the arrows in FIG. 5A, the reinforcing fiber (in the form of an uncoated tow 106' in the depicted embodiment) initially in contact with the contact locations 124 can be advanced or moved away from the contact locations 124. For example, as shown in FIG. 5B, by rotating the frame end 118 clockwise by 180°, the uncoated tow 106' may be advanced such that the regions 152A, 152B are no longer in contact with the fins 150A, 150B, respectively, that each define a contact location 124.

Referring to FIGS. 5A and 5B, it will be appreciated that, in at least some embodiments, the motion of the frame end 118 is such that the fiber, e.g., uncoated tow 106', does not slide relative to the frame end 118, which can help minimize raising fuzz and broken filament ends. When the uncoated tow 106' does not slide relative to the frame end 118, then the regions 152 of the uncoated tow 106' will remain in contact with the fins 150 until the rotation of the frame end 118 reaches the right or left extreme positions (in the end views of FIGS. 5A and 5B), where the regions 152 will travel down the side of the "curtain" formed by the uncoated tow 106' for coating in a free state. For the depicted embodiment of FIGS. 5A and 5B, the amount of rotation needed to "free" the regions 152 from contact at the contact locations 124 is 180°, but the linear distance the uncoated tow 106' must move to be free from contacting the fins 150 may be reduced by reducing the perimeter of the frame end 118. In some embodiments, using two or more supporting frame ends 118 in a roller form similar to the configuration of FIGS. 5A and 5B (e.g., a generally cylindrical shape, with a length of the roller extending along the transverse direction as shown in FIG. 3A) may allow a further reduction of the perimeter of the frame end 118, and the smaller diameter end rollers may not need to rotate a full 180° to free the uncoated tow 106' due to their small diameters, which may minimize the linear tow length in momentary contact with the fins 150. In some embodiments, the multiple (e.g., two or more) small end rollers may be linked in their rotation by a central gear that moves all of the end rollers synchronously, which can help prevent sliding contact with the tow.

Figure 6:
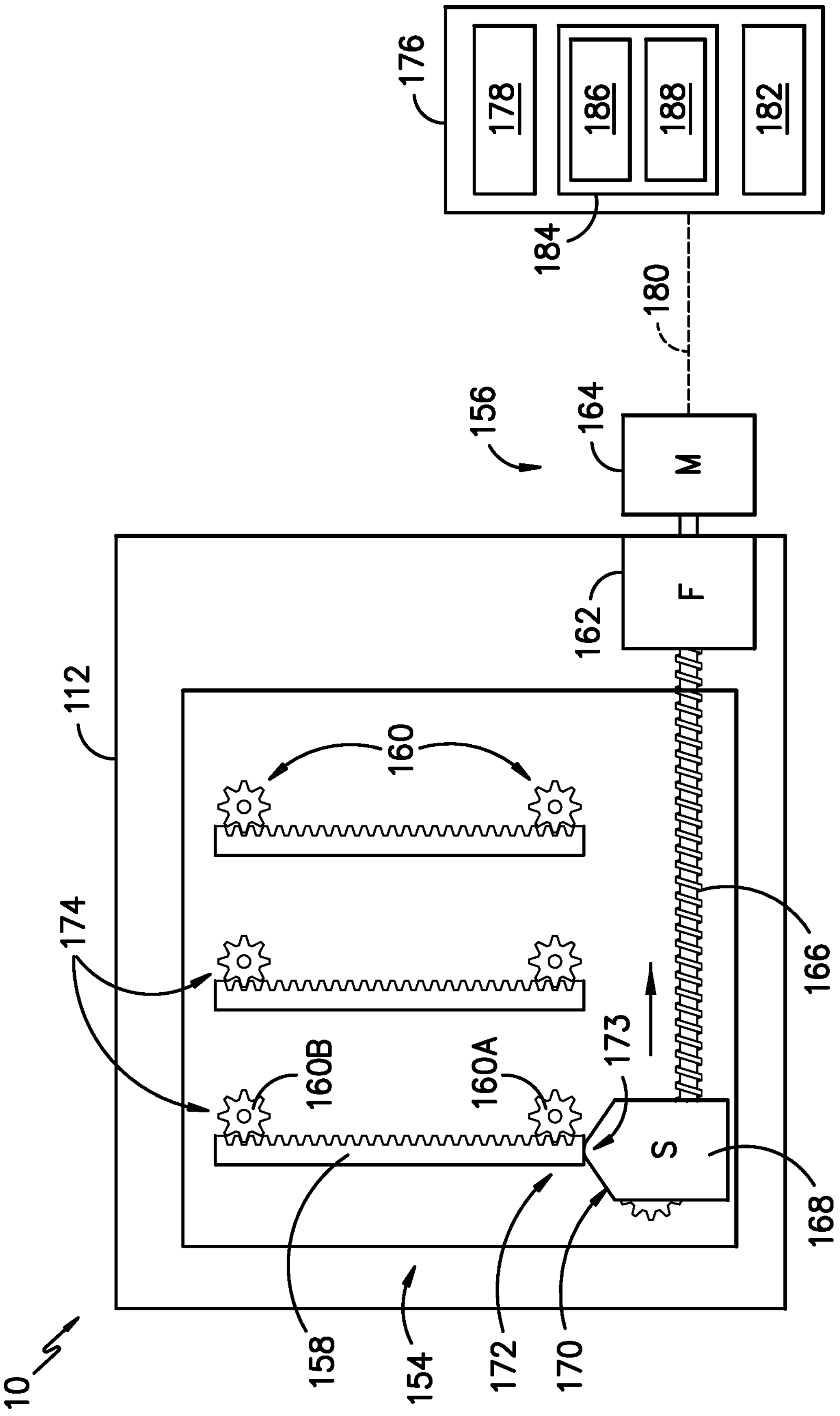
FIG. 6 is a schematic view of a system having a movement mechanism in accordance with an exemplary aspect of the present disclosure.

As shown in FIG. 6, the frame 112 may be part of a system 10 for coating reinforcing fiber of a composite component, such as the composite component 100 of FIG. 1. In addition to the frame 112, the system 10 can include a movement mechanism 154 that includes an actuator 156, e.g., which initiates motion of one or more components of the movement mechanism 154. The movement mechanism 154 may be operably coupled to the frame 112 to induce movement of the reinforcing fiber relative to the frame 112.

In some embodiments, such as the embodiment illustrated in FIG. 6, the movement mechanism 154 includes a rack 158 and at least one gear 160 in operative communication with the rack 158, e.g., in a rack and pinion type configuration. As shown in FIG. 6, in some embodiments, the at least one gear 160 may be a first gear 160A and a second gear 160B, which are disposed at opposite ends of the rack 158.

Keeping with the embodiment of FIG. 6, the depicted actuator 156 includes a rotary vacuum feedthrough 162 operably coupled to a drive motor 164. A screw drive member 166 is operably coupled to the rotary vacuum feedthrough 162, and a slider 168 defining a cam 170 is disposed on the screw drive member 166. The cam 170 is configured to contact the rack 158, e.g., to induce linear motion of the rack 158 as the slider 168 translates along the screw drive member 166. For example, the drive motor 164 drives the rotary vacuum feedthrough 162 to rotate the screw drive member 166, which causes the slider 168 to translate along the screw drive member 166. When the cam 170 is in contact with the rack 158, e.g., at a rack end 172 of the rack 158 as shown in FIG. 6, the cam 170 moves along an end surface 173 of the rack end 172 and bears against the rack 158 to initiate linear motion of the rack 158. For instance, the end surface 173 may define a follower surface shaped complementary to the cam 170.

It will be appreciated that, although not depicted in the figures, each of the rack 158 and the at least one gear 160 defines a plurality of gear teeth that mesh with one another such that linear motion of the rack 158 induces rotational motion of the one or more gears 160. In some embodiments, the rotational motion of the one or more gears 160 may be used, e.g., to rotate a frame end 118 of the frame 112 as described with respect to FIGS. 5A and 5B. In other embodiments, the reinforcing fiber may be in contact with the rack 158 and/or gear(s) 160, such that the linear motion of the rack 158 and/or the rotational motion of the gear(s) 160 causes the reinforcing fiber to move relative to the frame 112, which may promote adequate coating of the reinforcing fiber by exposing a low or insufficiently coated region or an uncoated region of the reinforcing fiber while the coating process is ongoing. Also, it will be understood that, instead of translating the rack 158 with the actuator 156, in other embodiments an actuator 156, configured differently from the actuator 156 shown in FIG. 6, could rotate the one or more gears 160 instead of inducing linear motion of the rack 158.

As further illustrated in FIG. 6, in at least some embodiments, multiple rack and gear assemblies 174 may be included in the system 10. Each rack and gear assembly 174 may include a rack 158 and at least one gear 160 configured as described above. The rack and gear assemblies 174 may be spaced equidistant from one another within or adjacent the frame 112, or in other embodiments, at least one spacing distance between adjacent rack and gear assemblies 174 may be different from at least one other spacing distance between other adjacent rack and gear assemblies 174. Additionally, multiple cams may be included to move multiple frame ends similarly or via other motion devices.

Moreover, the system 10 may include a controller 176, with the controller 176 being operably connected to the actuator 156, such as to the drive motor 164 of the actuator 156 shown in FIG. 6. Specifically, the controller 176 generally includes a network interface 178. The network interface 178 may be operable with any suitable wired or wireless communications network for communicating data with other components of, e.g., the system 10 and/or other components or systems not depicted. As is illustrated using phantom lines, for the embodiment of FIG. 6, the network interface 178 utilizes a wireless communication network 180 to communicate data with other components. For example, through the network interface 178 of the controller 176 and the wireless communication network 180, the controller 176 is operably coupled to the actuator 156. It will be appreciated, of course, that although the network interface 178 utilizes the wireless communication network 180 for the embodiment of FIG. 6, in other embodiments, the network interface 178 may instead utilize a wired communication network or a combination of wired and wireless communication networks.

Referring still to FIG. 6, the controller 176 further includes one or more processors 182 and memory devices 184. The memory device 184 stores data 186 and instructions 188 accessible by the one or more processors 182. The one or more processors 182 can include any suitable processing device, such as a microprocessor, microcontroller, integrated circuit, logic device, and/or other suitable processing device. The one or more memory devices 184 can include one or more computer-readable media, including, but not limited to, non-transitory computer-readable media, RAM, ROM, hard drives, flash drives, and/or other memory devices. The instructions 188, when executed by the one or more processors 182, cause the controller 176 to perform functions. The instructions 188 within the memory device 184 can be any set of instructions that, when executed by the one or more processors 182, cause the one or more processors 182 to perform operations, such as one or more of the operations described herein. In certain exemplary embodiments, the instructions 188 within the memory device 184 can be software written in any suitable programming language or can be implemented in hardware. Additionally and/or alternatively, the instructions can be executed in logically and/or virtually separate threads on processor(s) 182. The memory device(s) 184 can further store other data 188 that can be accessed by the processor(s) 182.

In such a manner, it will be appreciated that in at least certain embodiments, the controller 176 may be configured to initiate movement of the movement mechanism 154, e.g., via the actuator 156, to induce movement of the reinforcing fiber relative to the frame 112. For example, the controller 176 may be configured to operate the actuator 156, and thereby initiate movement of the movement mechanism 154, in response to data received from one or more sensors, e.g., disposed on the frame 112 and/or within the reactor 114 (FIG. 2). As an example, the controller 176 may be configured to operate the actuator 156 after the flow of reactants 115 (FIG. 2) has been flowing within the reactor 114 for a given amount of time, or when a temperature and/or pressure within the reactor 114 has reached a threshold value.

As described herein, in at least some embodiments, the frame 112 includes a frame end 118 including at least one contact location 124 (e.g., 124A, 124B) where the reinforcing fiber (e.g., fiber 104 (FIG. 1) and/or uncoated tows 106' (FIG. 2)) contacts the frame 112. For example, the frame end 118 may have a cross-sectional shape that defines one or more contact locations 124 (e.g., 124A, 124B, etc.). As previously discussed, the cross-sectional shape may be a duckbill shape, an opened mouth shape, a ribbed shape, a tooth shape, a fluted shape, or a finned shape, e.g., as described with respect to FIGS. 3B through 4E. The movement mechanism 154 may be configured to rotate the frame end 118 to change a position of the reinforcing fiber relative to at least one contact location 124. For instance, the actuator 156 of the movement mechanism 154, e.g., as illustrated in FIG. 6, may be operated to rotate the frame end 118 to advance the reinforcing fiber from a first position P1 to a second position P2 as shown in FIGS. 5A and 5B.

Figure 7A:
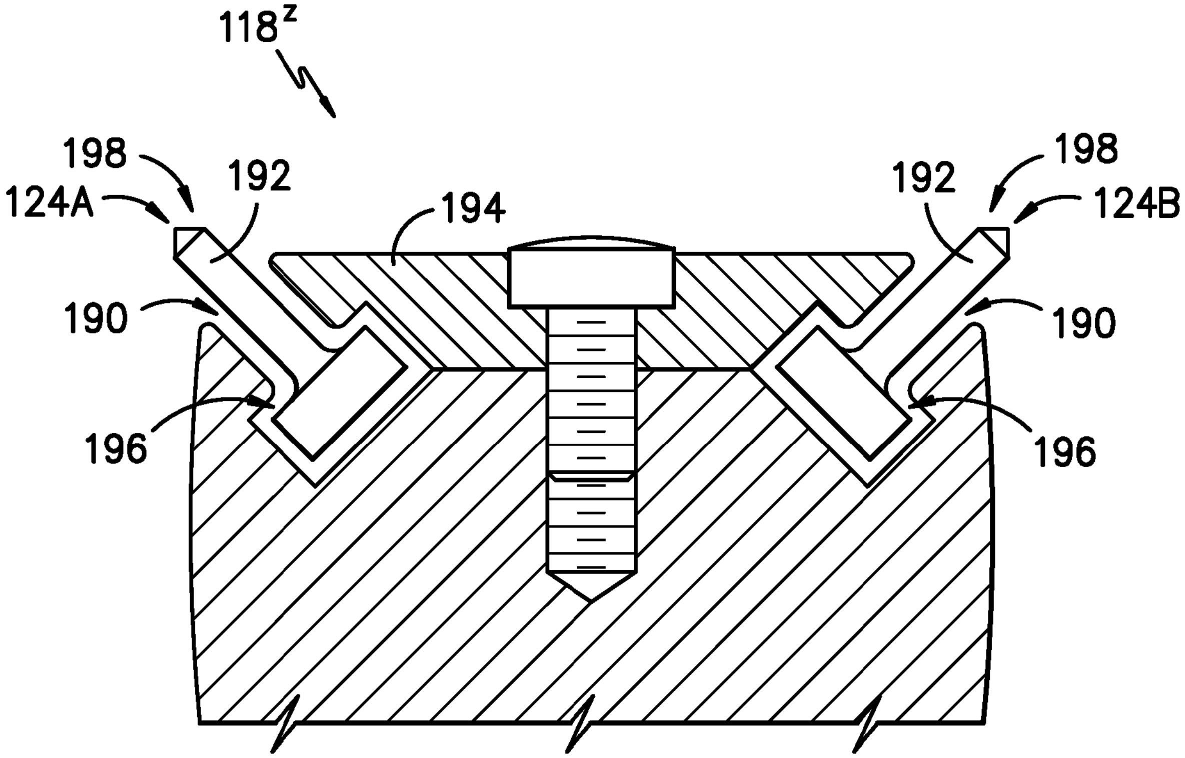
FIG. 7A is a schematic end view of a frame end having a vibrating spline in accordance with an exemplary aspect of the present disclosure.
Figure 7B:
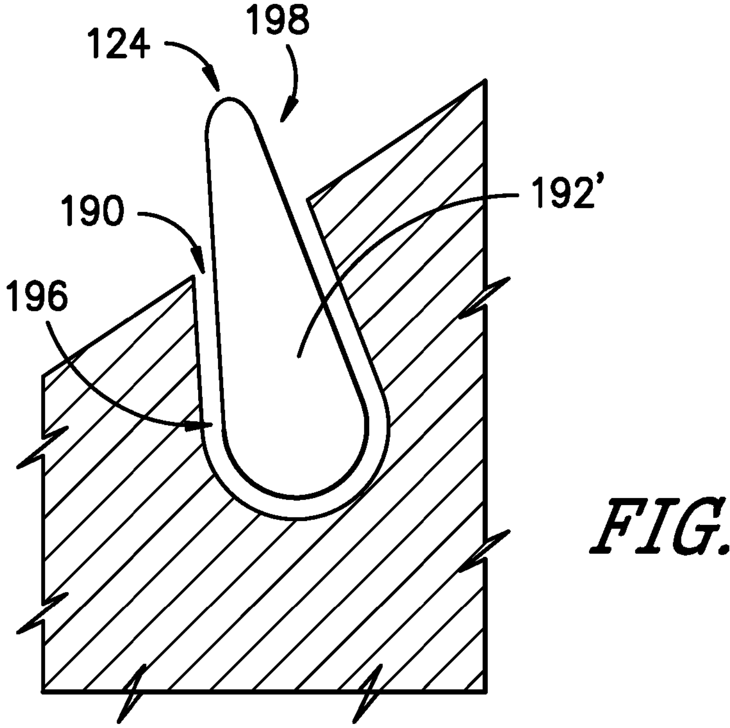
FIG. 7B is a schematic end view of a frame end having a vibrating spline in accordance with another exemplary aspect of the present disclosure.

Referring now to FIGS. 7A and 7B, in some embodiments, the frame end 118$^{Z}$ (e.g., of the frame 112 of FIGS. 3B and 3C) may vibrate, thereby causing the reinforcing fiber to move relative to the contact locations 124A, 124B. For example, a frame end 118 of the frame 112 may define one or more openings 190, with a spline 192 disposed in each respective opening 190. Each spline 192 may define at least one contact location 124 (e.g., 124A, 124B, respectively).

The frame 112 may include a retention cap 194 that retains the one or more splines 192 within a respective opening 190. For instance, as shown in FIG. 7A, the retention cap 194 may have a cross-sectional shape complementary to a cross-sectional shape of each opening 190 to ensure the one or more splines 192 do not separate from the frame 112 while permitting motion of each spline 192. That is, the one or more splines 192 may move relative to the frame end 118 and the retention cap 194, e.g., the one or more splines 192 may vibrate, but the frame end 118 and retention cap 194 may be shaped such that the one or more splines 192 do not separate from the frame 112.

In at least some embodiments, the one or more splines 192 are in operative communication with a movement mechanism 154, such as the movement mechanism 154 described with respect to FIG. 6 or a different movement mechanism 154. Referring to FIG. 7A, one or more splines 192 of the frame 112 may have a cross-sectional shape that is generally a T shape. Referring to FIG. 7B, one or more splines 192' of the frame 112 may have a cross-sectional shape that is generally a teardrop shape.

Each spline 192, 192' may include a rocker end 196 and a contact end 198 opposite the rocker end 196. For the generally T-shaped splines 192 shown in FIG. 7A, the crossbar of the T defines the rocker end 196. For the generally teardrop-shaped splines 192' shown in FIG. 7B, the bulbous end of the teardrop defines the rocker end 196'. For any cross-sectional shape of the spline 192, 192', the contact end 198 of the spline 192, 192' may define a contact location 124A, 124B for contact between the reinforcing fiber and the frame 112.

It will be appreciated that the rocker end 196 may be in operative communication with the movement mechanism 154 to initiate movement of the spline 192. For example, an actuator 156 of the movement mechanism 154 may be operated to drive the one or more splines 192 in a vibratory or other type of motion. The one or more splines 192 may be driven orbitally, along the longitudinal direction L, the lateral direction T (FIG. 3A), along a widthwise direction W, or in any other suitable direction or motion. In other embodiments, the one or more splines 192 may be driven from support bars (not shown) underneath the splines 192, driven by gas jets (not shown) underneath the splines 192, or driven by any other suitable actuator 156 and/or movement mechanism 154.

Various mechanical mechanisms for initiating vibration of the reinforcing fiber and/or frame 112 are described with respect to FIGS. 7A and 7B. Alternatively or additionally, non-mechanical actuation may be utilized to initiate vibration of the reinforcing fiber and/or frame 112. For example, the reinforcing fiber may naturally vibrate if a rate of the flow of reactants 115 (i.e., a gas flow rate) within the reactor 114 (FIG. 2) is above a threshold gas flow rate. Similarly, the reinforcing fiber may naturally vibrate when a gas pressure within the reactor 114 (FIG. 2) is at or above a threshold pressure. As another example, acoustic waveguides that penetrate the reactor 114 (FIG. 2) could be used to drive vibration of the reinforcing fiber and/or frame 112 within the reactor 114. Vibration of the reinforcing fibers and/or frame 112 may be achieved using any individual or combination of the mechanical or non-mechanical actuation mechanisms described herein.

Further, it will be appreciated that, without regard to whether the vibration is actuated mechanically or nonmechanically, a vibration pattern may be established for the reinforcing fiber and/or the frame 112. The vibration pattern may be fixed, swept, burst, or random frequency or amplitude.

Figure 8:
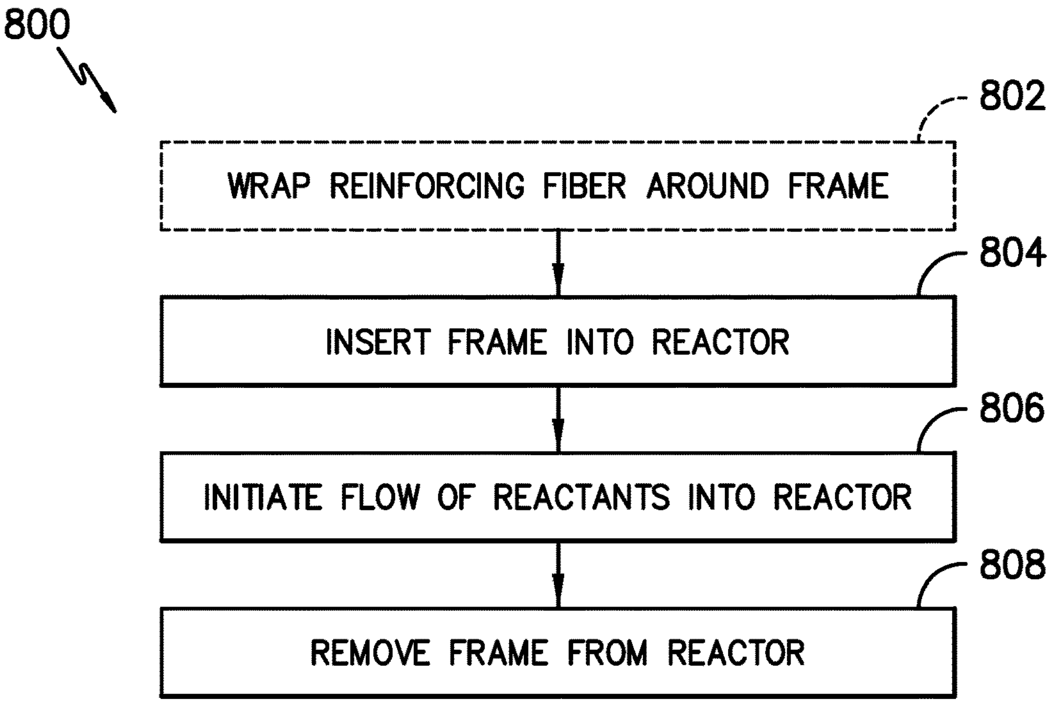
FIG. 8 is a flow chart diagram of a method of coating reinforcing fiber of a composite component in accordance with an exemplary aspect of the present disclosure.

Referring now to FIG. 8, a flow diagram of a method 800 of coating reinforcing fiber of a composite component in accordance with an exemplary aspect of the present disclosure is provided. One or more of the exemplary systems 10 and/or frames 112 described above with reference to FIGS. 2 through 7B may be utilized in the method 800 of FIG. 8 to coat a reinforcing fiber of a composite component, such as the composite component 100 described with respect to FIG. 1. Accordingly, it will be appreciated that the method 800 may generally be utilized with a frame having a cross-sectional shape and/or movement mechanism for minimizing or eliminating low or uncoated regions of the reinforcing fiber upon completion of the coating process. However, in other exemplary aspects, the method 800 may additionally or alternatively be utilized with any other suitable support frame and/or mechanism for promoting movement of fiber relative to a support frame during a coating process.

As is depicted, the method 800 includes at (802) wrapping reinforcing fiber around a frame 112, which is shown as an optional step for preparing the fiber for coating thereon. As described herein, the frame includes at least one frame end 118 having a cross-sectional shape that includes a first contact location 124A spaced apart from a second contact location 124B by a separation length 126. In at least some embodiments, wrapping the reinforcing fiber around the frame 112 comprises unwrapping the fiber from a bobbin 110 (FIG. 2), e.g., with the fiber under a winding tension as described herein, and disposing or placing the reinforcing fiber in contact with the first contact location 124A and the second contact location 124B. When wrapped around the frame 112, the reinforcing fiber extends from the first contact location 124A to the second contact location 124B such that a minimal length of the uncoated tow 106' is within a minimum distance 130 of the frame 112, e.g., with the fiber under a steady state tension once unwound from the bobbin 110 (FIG. 2) as described herein. Various cross-sectional shapes for the frame end 118 are described herein, e.g., with respect to FIGS. 4A through 4F.

As described herein, a chemical vapor deposition (CVD) process may be used to deposit a coating 116 (FIG. 2) on the reinforcing fiber. Referring to FIG. 8, the method 800 includes at (804) inserting the frame into a reactor 114 (FIG. 2) and at (806) initiating a flow of reactants 115 (FIG. 2) into the reactor 114. A temperature and a pressure within the reactor 114 may be elevated, e.g., compared to an ambient temperature and pressure, to aid in the formation of the coating 116 from the reactants 115 on the reinforcing fiber. Upon completion of the deposition process, as shown at (808), the method 800 includes removing the frame 112 from the reactor 114.

Figure 9:
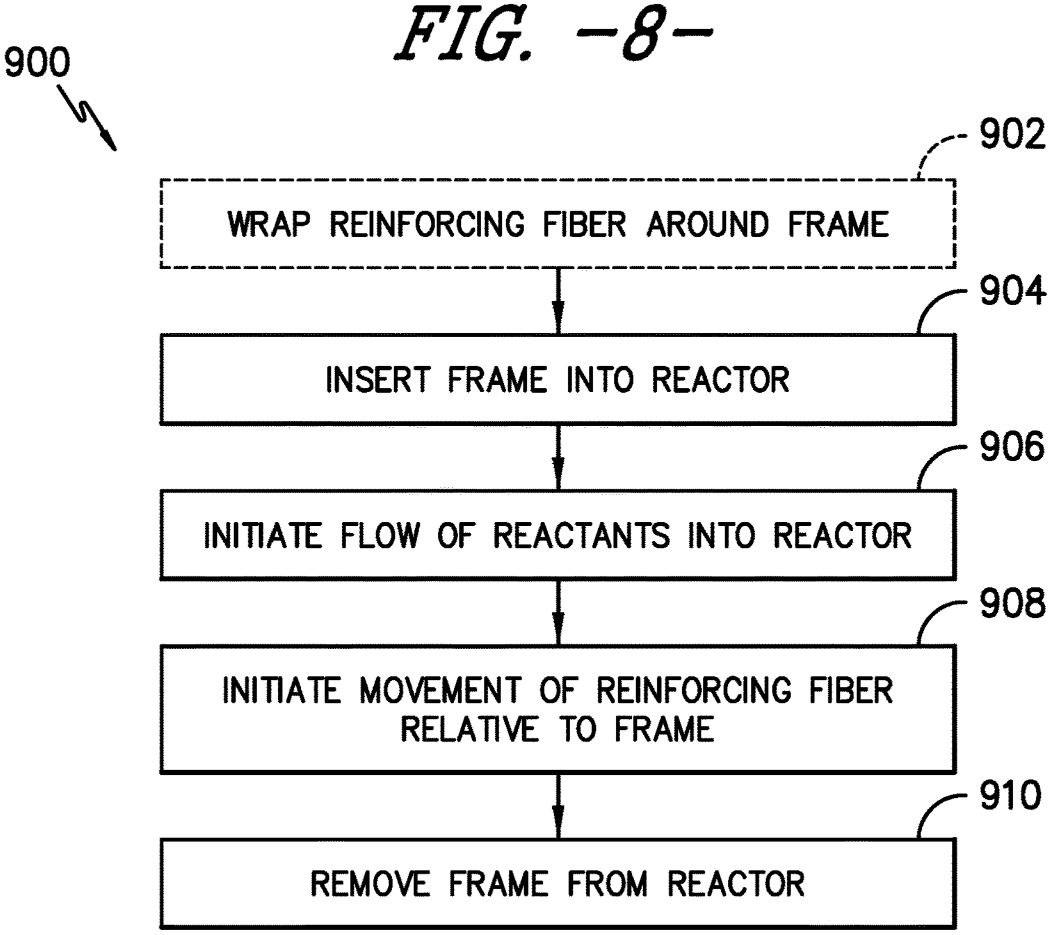
FIG. 9 is a flow chart diagram of a method of coating reinforcing fiber of a composite component in accordance with another exemplary aspect of the present disclosure.

Referring now to FIG. 9, a flow diagram of a method 900 of coating reinforcing fiber of a composite component in accordance with an exemplary aspect of the present disclosure is provided. One or more of the exemplary systems 10 and/or frames 112 described above with reference to FIGS. 2 through 7B may be utilized in the method 900 of FIG. 9 to coat a reinforcing fiber of a composite component, such as the composite component 100 described with respect to FIG. 1. Accordingly, it will be appreciated that the method 900 may generally be utilized with a frame having a cross-sectional shape and/or movement mechanism for minimizing or eliminating low or uncoated regions of the reinforcing fiber upon completion of the coating process. However, in other exemplary aspects, the method 900 may additionally or alternatively be utilized with any other suitable support frame and/or mechanism for promoting movement of fiber relative to a support frame during a coating process.

As is depicted, the method 900 includes at (902) wrapping reinforcing fiber around a frame 112. As described herein, wrapping the reinforcing fiber around the frame 112 may include placing the reinforcing fiber in contact with a frame end 118 of the frame 112. In some embodiments, the frame includes at least one frame end 118 having a cross-sectional shape that includes a first contact location 124A spaced apart from a second contact location 124B by a separation length 126, and various cross-sectional shapes for the frame end 118 are described herein, e.g., with respect to FIGS. 4A through 4F.

In at least some embodiments, a chemical vapor deposition (CVD) process may be used to deposit a coating 116 (FIG. 2) on the reinforcing fiber. Referring to FIG. 9, the method 900 includes at (904) inserting the frame into a reactor 114 (FIG. 2) and at (906) initiating a flow of reactants 115 (FIG. 2) into the reactor 114. A temperature and a pressure within the reactor 114 may be elevated, e.g., compared to an ambient temperature and pressure, to aid in the formation of the coating 116 from the reactants 115 on the reinforcing fiber.

Further, the method 900 includes at (908) initiating movement of the reinforcing fiber relative to the frame while the frame is positioned in the flow of reactants. That is, while the reactants 115 are flowing within the reactor 114, e.g., following initiation of the flow as shown at (906), the reinforcing fiber may be moved relative to the frame 112. Such movement of the reinforcing fiber relative to the frame may expose one or more regions of the reinforcing fiber that, without movement, could be uncoated or have a low coating thickness at the completion of the coating process. Accordingly, by initiating movement of the reinforcing fiber relative to the frame while the frame is positioned in the flow of reactants, regions of low or uncoated reinforcing fiber can be minimized or eliminated. It will be appreciated that such regions could be minimized in number and/or length or the like, or such regions could be eliminated altogether.

As described herein, the frame 112 can comprise a movement mechanism 154. In some embodiments, the movement mechanism 154 shifts a position of the reinforcing fiber relative to the frame 112. For example, initiating movement of the reinforcing fiber relative to the frame 112 as shown at (908) may include operating an actuator 156 of the movement mechanism 154 to shift or advance a position of the reinforcing fiber from a first position P1 (FIG. 5A) to a second position P2 (FIG. 5B) relative to the frame 112. In some embodiments, the movement mechanism 154 rotates a frame end 118 of the frame 112 to advance the reinforcing fiber from the first position P1 to the second position P2.

In other embodiments, the movement mechanism 154 is in operative communication with at least one spline 192 (FIGS. 7A, 7B), and initiating movement of the reinforcing fiber relative to the frame comprises initiating vibration of the at least one spline 192. The at least one spline 192 may include a rocker end 196 and a contact end 198 opposite the rocker end 196, and the at least one spline 192 may have a cross-sectional shape that is generally a T shape, a teardrop shape, or other suitable shape that defines the rocker end 196 and contact end 198. In some embodiments, the contact end 198 defines a point contact between the at least one spline 192 and the reinforcing fiber.

In some embodiments, initiating movement of the reinforcing fiber relative to the frame 112 comprises initiating vibration of the reinforcing fiber or the frame 112. For instance, initiating vibration of the frame 112 includes mechanically initiating vibration of the frame. As another example, initiating vibration of the frame 112 includes manipulating a gas pressure within the reactor 114 (FIG. 2) to induce vibration of the frame 112.

Other ways of inducing movement between the reinforcing fiber and the frame 112 may be used as well. Further, such movement may occur once, twice, three, or four or more times as the reactants 115 (FIG. 2) flow within the reactor 114 (FIG. 2). For example, a controller 176 (FIG. 6) may periodically initiate movement of the reinforcing fiber relative to the frame 112, e.g., based on the passage of time, a temperature within the reactor 114, a pressure within the reactor 114, etc.

Referring to FIG. 9, upon completion of the process of depositing the coating 116 (FIG. 2), as shown at (910), the method 900 includes removing the frame 112 from the reactor 114.

As described herein, the present subject matter provides apparatus and methods for reducing or eliminating low or uncoated regions of coated fibers. For example, the number and/or configuration of contact locations between a frame on which uncoated fiber is disposed for support during a coating process minimizes low or uncoated regions of the coated fiber. As another example, moving the fiber relative to the frame during the coating process can minimize or reduce low or uncoated regions of the coated fiber.

Further aspects are provided by the subject matter of the following clauses:

A frame for use in coating a reinforcing fiber, the frame comprising: a first frame end having a first cross-sectional shape, wherein the first cross-sectional shape includes one or more contact locations that are spaced apart from each other, and wherein the reinforcing fiber contacts the first frame end at the one or more contact locations.

The frame of any preceding claim, further comprising: a second frame end opposite the first frame end, wherein the second frame end has a second cross-sectional shape, wherein the second cross-sectional shape includes one or more contact locations that are spaced apart from each other, and wherein the reinforcing fiber contacts the second frame end at the one or more contact locations.

The frame of any preceding claim, wherein the second cross-sectional shape is the same as the first cross-sectional shape.

The frame of any preceding claim, wherein the first frame end includes a first contact location spaced apart from an adjacent second contact location by a separation length, wherein a first length is defined by the first contact location, wherein the first length is less than the separation length.

The frame of any preceding claim, wherein each contact locations define a point contact between the first frame end and the reinforcing fiber.

The frame of any preceding claim, wherein the first frame end is static relative to the frame.

The frame of any preceding claim, wherein the frame end is moveable relative to the frame.

The frame of any preceding claim, wherein the one or more contact locations are a plurality of contact locations, and wherein the plurality of contact locations has a periodicity factor of at least 2.

The frame of any preceding claim, wherein the first cross-sectional shape is a duckbill shape, wherein the duckbill shape comprises a first contact location of the one or more contact locations and a second contact location of the one or more contact locations, wherein the duckbill shape is undercut adjacent each of the first contact location and the second contact location, and wherein the first contact location and the second contact location are separated by a generally V-shaped slot.

The frame of any preceding claim, wherein the first cross-sectional shape is an opened mouth shape, wherein the opened mouth shape comprises a first contact location of the one or more contact locations and a second contact location of the one or more contact locations, the first contact location and the second contact location separated by a generally V-shaped slot, and wherein the opened mouth shape comprises a rounded edge adjacent each of the first contact location and the second contact location and opposite the generally V-shaped slot.

The frame of any preceding claim, wherein the first cross-sectional shape is a tooth shape, wherein the tooth shape comprises a first contact location of the one or more contact locations, a second contact location of the one or more contact locations, and a midline defined between the first contact location and the second contact location, and wherein the tooth shape further comprises a first linear edge adjacent the first contact location and a second linear edge adjacent the second contact location, each of the first linear edge and the second linear edge extending inward toward the midline at a non-zero angle less than 90°.

The frame of any preceding claim, wherein the first cross-sectional shape is a ribbed shape, and wherein the ribbed shape comprises a plurality of ribs, each rib of the plurality of ribs defining a contact location of the one or more contact locations.

The frame of any preceding claim, wherein the first cross-sectional shape is a fluted shape, and wherein the fluted shape comprises a plurality of semicircular protrusions, each semicircular protrusion of the plurality of semicircular protrusions defining a contact location of the one or more contact locations.

The frame of any preceding claim, wherein the first cross-sectional shape is a finned shape, and wherein the finned shape comprises a plurality of fins, each fin of the plurality of fins defining a contact location of the one or more contact locations.

The frame of any preceding clause, wherein a ratio of a total length of the reinforcing fiber within a minimum distance from the frame and a contact length where the reinforcing fiber contacts the frame to a separation length for the frame end is within a range of 2 to about 10,000.

The frame of any preceding clause, wherein a ratio of a total length of the reinforcing fiber within a minimum distance from the frame and a contact length where the reinforcing fiber contacts the frame to a separation length for the frame end is within a range of 5 to 1,000.

A method of coating a reinforcing fiber of a composite component, the method comprising: wrapping the reinforcing fiber around the first frame end of the frame of any preceding claim; inserting the frame into a reactor; and initiating a flow of reactants into the reactor.

The method of any preceding claim, wherein the reinforcing fiber is in the form of a tow, and wherein the minimum distance is at least two times a diameter of the tow.

The method of any preceding claim, wherein the flow of reactants deposits a coating on the reinforcing fiber in a chemical vapor deposition process.

The method of any preceding claim, wherein the reinforcing fiber comprises a non-oxide silicon-based materials, non-oxide carbon-based materials, oxide ceramics, or mixtures thereof.

The method of any preceding claim, wherein the first frame end is static relative to the frame.

The method of any preceding claim, further comprising: moving the first frame end such that the contact location changes during the flow of reactants into the reactor.

A system for coating reinforcing fiber of a composite component, the system comprising: a frame including at least one contact location for contacting the reinforcing fiber; and a movement mechanism including an actuator, wherein the movement mechanism is operably coupled to the frame to induce movement of the reinforcing fiber relative to the frame.

The system of any preceding clause, wherein the movement mechanism comprises a rack and at least one gear in operative communication with the rack.

The system of any preceding clause, wherein the actuator comprises: a rotary vacuum feedthrough operably coupled to a drive motor, a screw drive member operably coupled to the rotary vacuum feedthrough, and a slider defining a cam, the slider disposed on the screw drive member, wherein the cam is configured to contact the rack.

The system of any preceding clause, wherein the frame includes a frame end comprising the at least one contact location.

The system of any preceding clause, wherein the frame end has a cross-sectional shape, wherein the cross-sectional shape includes the at least one contact location, and wherein the movement mechanism is configured to rotate the frame end to change a position of the reinforcing fiber relative to the at least one contact location.

The system of any preceding clause, wherein the cross-sectional shape is a duckbill shape, an opened mouth shape, a ribbed shape, a tooth shape, a fluted shape, or a finned shape.

The system of any preceding clause, wherein the frame includes a frame end defining an opening, wherein a spline is disposed in the opening, the spline in operative communication with the movement mechanism, and wherein the spline comprises the at least one contact location.

The system of any preceding clause, wherein the spline includes a rocker end and a contact end opposite the rocker end, wherein the spline has a cross-sectional shape that is generally a T shape with a cross-bar of the T shape defining the rocker end, and wherein the contact end defines the at least one contact location.

The system of any preceding clause, wherein the spline includes a rocker end and a contact end opposite the rocker end, wherein the spline has a cross-sectional shape that is generally a teardrop shape with a bulbous end defining the rocker end, and wherein the contact end defines the at least one contact location.

The system of any preceding clause, further comprising: a controller in operative communication with the movement mechanism, wherein the controller is configured for initiating the movement mechanism to induce movement of the reinforcing fiber relative to the frame.

The system of claim 1, wherein the frame is positioned within a reactor.

A method of coating a reinforcing fiber of a composite component, the method comprising: inserting a frame wrapped with the reinforcing fiber into a reactor; initiating a flow of reactants into the reactor; and initiating movement of the reinforcing fiber relative to the frame while the frame is positioned in the flow of reactants.

The method of any preceding clause, wherein initiating movement of the reinforcing fiber relative to the frame while the frame comprises actuating a movement mechanism provided on the frame, wherein the movement mechanism shifts a position of the reinforcing fiber relative to the frame.

The method of any preceding clause, wherein the actuating the movement mechanism advances the reinforcing fiber from a first position to a second position.

The method of any preceding clause, further comprising: prior to inserting the frame wrapped with the reinforcing fiber into the reactor, wrapping the reinforcing fiber around the frame by disposing the reinforcing fiber in contact with a frame end of the frame, and wherein the movement mechanism rotates the frame end to advance the reinforcing fiber from a first position to a second position.

The method of any preceding clause, wherein the movement mechanism is in operative communication with at least one spline, and wherein initiating movement of the reinforcing fiber relative to the frame comprises initiating vibration of the at least one spline.

The method of any preceding clause, wherein the at least one spline includes a rocker end and a contact end opposite the rocker end, and wherein the contact end defines a point contact between the at least one spline and the reinforcing fiber.

The method of any preceding clause, wherein the at least one spline has a cross-sectional shape that is generally a teardrop shape having a bulbous end and a contact end opposite the bulbous end, and wherein the contact end defines a point contact between the at least one spline and the reinforcing fiber.

The method of any preceding clause, wherein initiating movement of the reinforcing fiber relative to the frame comprises initiating vibration of the frame.

The method of any preceding clause, wherein initiating vibration of the frame includes mechanically initiating vibration of the frame, manipulating a gas pressure within the reactor to induce vibration of the frame, or both.

This written description uses examples to disclose the present disclosure, including the best mode, and also to enable any person skilled in the art to practice the disclosure, including making and using any devices or systems and performing any incorporated methods. The patentable scope of the disclosure is defined by the claims and may include other examples that occur to those skilled in the art. Such other examples are intended to be within the scope of the claims if they include structural elements that do not differ from the literal language of the claims or if they include equivalent structural elements with insubstantial differences from the literal language of the claims.

We claim:

1. A frame for use in coating a reinforcing fiber, the frame comprising:

a first frame end having a first cross-sectional shape, wherein the first cross-sectional shape includes one or more contact locations that are spaced apart from each other, and wherein the reinforcing fiber contacts the first frame end at the one or more contact locations, and wherein at least a portion of the reinforcing fiber is spaced apart from the first frame end via support from the one or more contact locations where the portion wraps around the first frame end.

2. The frame of claim 1, further comprising:

a second frame end opposite the first frame end, wherein the second frame end has a second cross-sectional shape, wherein the second cross-sectional shape includes one or more contact locations that are spaced apart from each other, and wherein the reinforcing fiber contacts the second frame end at the one or more contact locations.

3. The frame of claim 2, wherein the second cross-sectional shape is the same as the first cross-sectional shape.

4. The frame of claim 1, wherein the first frame end includes a first contact location spaced apart from an adjacent second contact location by a separation length, wherein a first length is defined by the first contact location, wherein the first length is less than the separation length.

5. The frame of claim 1, wherein each contact locations define a point contact between the first frame end and the reinforcing fiber.

6. The frame of claim 1, wherein the first frame end is static relative to the frame.

7. The frame of claim 1, wherein the frame end is moveable relative to the frame.

8. The frame of claim 1, wherein the one or more contact locations are a plurality of contact locations, and wherein the plurality of contact locations has a periodicity factor of at least 2.

9. The frame of claim 1, wherein the first cross-sectional shape is a duckbill shape, wherein the duckbill shape comprises a first contact location of the one or more contact locations and a second contact location of the one or more contact locations, wherein the duckbill shape is undercut adjacent each of the first contact location and the second contact location, and wherein the first contact location and the second contact location are separated by a generally V-shaped slot.

10. The frame of claim 1, wherein the first cross-sectional shape is an opened mouth shape, wherein the opened mouth shape comprises a first contact location of the one or more contact locations and a second contact location of the one or more contact locations, the first contact location and the second contact location separated by a generally V-shaped slot, and wherein the opened mouth shape comprises a rounded edge adjacent each of the first contact location and the second contact location and opposite the generally V-shaped slot.

11. The frame of claim 1, wherein the first cross-sectional shape is a tooth shape, wherein the tooth shape comprises a first contact location of the one or more contact locations, a second contact location of the one or more contact locations, and a midline defined between the first contact location and the second contact location, and wherein the tooth shape further comprises a first linear edge adjacent the first contact location and a second linear edge adjacent the second contact location, each of the first linear edge and the second linear edge extending inward toward the midline at a non-zero angle less than 90°.

12. The frame of claim 1, wherein the first cross-sectional shape is a ribbed shape, and wherein the ribbed shape comprises a plurality of ribs, each rib of the plurality of ribs defining a contact location of the one or more contact locations.

13. The frame of claim 1, wherein the first cross-sectional shape is a fluted shape, and wherein the fluted shape comprises a plurality of semicircular protrusions, each semicircular protrusion of the plurality of semicircular protrusions defining a contact location of the one or more contact locations.

14. The frame of claim 1, wherein the first cross-sectional shape is a finned shape, and wherein the finned shape comprises a plurality of fins, each fin of the plurality of fins defining a contact location of the one or more contact locations.

* * * * *